United States Patent
Saji

(10) Patent No.: US 11,367,829 B2
(45) Date of Patent: Jun. 21, 2022

(54) ELASTIC WAVE DEVICE, HIGH-FREQUENCY FRONT END CIRCUIT, AND COMMUNICATION APPARATUS

(71) Applicant: Murata Manufacturing Co., Ltd., Nagaokakyo (JP)

(72) Inventor: Mari Saji, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 535 days.

(21) Appl. No.: 15/724,569

(22) Filed: Oct. 4, 2017

(65) Prior Publication Data

US 2018/0175282 A1 Jun. 21, 2018

(30) Foreign Application Priority Data

Dec. 19, 2016 (JP) .............................. JP2016-245758

(51) Int. Cl.
| | | |
|---|---|---|
| H03H 9/02 | (2006.01) | |
| H01L 41/187 | (2006.01) | |
| H01L 41/277 | (2013.01) | |
| H03H 9/25 | (2006.01) | |
| H01L 41/08 | (2006.01) | |
| H01L 41/253 | (2013.01) | |
| C30B 29/30 | (2006.01) | |
| H03H 9/145 | (2006.01) | |

(52) U.S. Cl.
CPC ............ *H01L 41/277* (2013.01); *C30B 29/30* (2013.01); *H01L 41/081* (2013.01); *H01L 41/1873* (2013.01); *H01L 41/253* (2013.01); *H03H 9/02559* (2013.01); *H03H 9/02574* (2013.01); *H03H 9/02834* (2013.01); *H03H 9/14541* (2013.01); *H03H 9/25* (2013.01)

(58) Field of Classification Search
CPC .............. H01L 41/081; H03H 9/02559; H03H 9/02574; H03H 9/02834
USPC ....... 310/313 R, 313 A, 313 B, 313 C, 313 D
See application file for complete search history.

(56) References Cited

U.S. PATENT DOCUMENTS

| | | | |
|---|---|---|---|
| 2009/0152982 A1* | 6/2009 | Miura ................ | H03H 9/02559 310/313 B |
| 2011/0133600 A1* | 6/2011 | Kimura ............... | H03H 9/0222 310/313 B |
| 2013/0026881 A1 | 1/2013 | Okamoto et al. | |
| 2014/0232239 A1* | 8/2014 | Iwasaki ............. | H03H 9/02559 310/313 C |

FOREIGN PATENT DOCUMENTS

WO 2011/158445 A1 12/2011

* cited by examiner

*Primary Examiner* — Derek J Rosenau
(74) *Attorney, Agent, or Firm* — Keating & Bennett, LLP

(57) ABSTRACT

An elastic wave device includes a piezoelectric substrate, an IDT electrode including a first electrode layer located on the piezoelectric substrate and including one of Mo and W as a main component and a second electrode layer laminated on the first electrode layer and including Cu as a main component, and a dielectric film located on the piezoelectric substrate and covering the IDT electrode. The piezoelectric substrate is made of lithium niobate. The dielectric film is made of silicon oxide. The elastic wave device utilizes Rayleigh waves propagating along the piezoelectric substrate.

18 Claims, 18 Drawing Sheets

ELASTIC WAVE DEVICE, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2016-245758 filed on Dec. 19, 2016. The entire contents of this application are hereby incorporated herein by reference.

BACKGROUND OF THE INVENTION

1. Field of the Invention

The present invention relates to an elastic wave device, a high-frequency front end circuit, and a communication apparatus.

2. Description of the Related Art

An existing elastic wave device has been widely used for a filter of a cellular phone or the like. International Publication No. 2011/158445, which will be described below, discloses an example of the elastic wave device. The elastic wave device includes a piezoelectric substrate made of $LiNbO_3$. An IDT (interdigital transducer) electrode is provided on the piezoelectric substrate. The IDT electrode includes a multilayer metal film formed by laminating a Mo layer and an Al layer in this order from the piezoelectric substrate side. The IDT electrode has low electrical resistance because it includes the Al layer. A dielectric film made of $SiO_2$ is provided on the piezoelectric substrate so as to cover the IDT electrode. Frequency temperature characteristics are improved by including the above-described dielectric film.

When the film thickness of the dielectric film made of silicon oxide, such as $SiO_2$, is increased, the frequency temperature characteristic (TCV) is improved but a fractional bandwidth is narrowed. On the other hand, when the film thickness of the dielectric film made of silicon oxide is decreased, the fractional bandwidth is increased but the frequency temperature characteristic is deteriorated. In this manner, the frequency temperature characteristic and the fractional bandwidth have a trade-off relationship.

As disclosed in International Publication No. 2011/158445, in the elastic wave device in which the dielectric film made of silicon oxide is provided, it is considered that the film thickness of the Al layer is increased in order to further lower the electrical resistance of the IDT electrode for reducing insertion loss of a filter. However, the inventors of the present invention have discovered that there is a problem of deterioration in the trade-off relationship between the frequency temperature characteristic and the fractional bandwidth because, as the film thickness of the Al layer is increased, the frequency temperature characteristic is deteriorated and the fractional bandwidth is not increased substantially.

SUMMARY OF THE INVENTION

Preferred embodiments of the present invention provide elastic wave devices, high-frequency front end circuits, and communication apparatuses that are capable of improving a trade-off relationship between a frequency temperature characteristic and a fractional bandwidth while lowering an electrical resistance of an IDT electrode.

An elastic wave device according to a preferred embodiment of the present invention includes a piezoelectric substrate, an IDT electrode including a first electrode layer which is provided on the piezoelectric substrate and includes one of Mo and W as a main component and a second electrode layer which is laminated on the first electrode layer and includes Cu as a main component, and a dielectric film that is provided on the piezoelectric substrate and covers the IDT electrode, wherein the piezoelectric substrate is made of lithium niobate, the dielectric film is made of silicon oxide, and the elastic wave device utilizes Rayleigh waves propagating along the piezoelectric substrate.

In an elastic wave device according to a preferred embodiment of the present invention, the first electrode layer includes Mo as the main component, and when a wave length which is defined by an electrode finger pitch of the IDT electrode is $\lambda$ and a film thickness of the first electrode layer and a film thickness of the second electrode layer, which are normalized by the wave length $\lambda$, are $h_{Mo}/\lambda(\%)$ and $h_{Cu}/\lambda(\%)$, respectively, an equation is satisfied:

$$h_{Mo}/\lambda \leq -0.8 \times h_{Cu}/\lambda + 1.8.$$

In this case, a fractional bandwidth is able to be effectively and stably increased. Therefore, a trade-off relationship between a frequency temperature characteristic and the fractional bandwidth can be further improved.

In an elastic wave device according to another preferred embodiment of the present invention, the first electrode layer includes Mo as the main component, and when a wave length which is defined by an electrode finger pitch of the IDT electrode is $\lambda$ and a film thickness of the first electrode layer, which is normalized by the wave length $\lambda$, is $h_{Mo}/\lambda$ (%), the film thickness $h_{Mo}/\lambda$ of the first electrode layer is equal to or lower than about 30%. In this case, an increase in a stress of the first electrode layer is able to be reduced or prevented and the piezoelectric substrate will not be easily damaged.

In an elastic wave device according to another preferred embodiment of the present invention, the first electrode layer includes Mo as the main component, Euler Angles ($\phi$, $\theta$, $\psi$) of the piezoelectric substrate are Euler Angles (0°±5°, $\theta$, 0°±5°), and when a wave length which is defined by an electrode finger pitch of the IDT electrode is $\lambda$ and a film thickness of the first electrode layer and a film thickness of the second electrode layer, which are normalized by the wave length $\lambda$, are $h_{Mo}/\lambda(\%)$ and $h_{Cu}/\lambda(\%)$, respectively, a combination of the film thickness $h_{Mo}/\lambda$ of the first electrode layer, the film thickness $h_{Cu}/\lambda$ of the second electrode layer, and $\theta$ in the Euler Angles ($\phi$, $\theta$, $\psi$) of the piezoelectric substrate is any one of combinations indicated in Table 1 to Table 6. In this case, a spurious SH (Shear Horizontal) wave is able to be reduced or prevented.

TABLE 1

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
| --- | --- | --- |
| $h_{Cu}/\lambda \leq 5.5$ | $0 < -0.8 \times h_{Cu}/\lambda + 1.8 \leq h_{Mo}/\lambda < 2.75$ | $34.7 \leq \theta \leq 41.4$ |
| $h_{Cu}/\lambda \leq 5.5$ | $2.75 \leq h_{Mo}/\lambda < 4.25$ | $33.6 \leq \theta \leq 45.7$ |
| $h_{Cu}/\lambda \leq 5.5$ | $4.25 \leq h_{Mo}/\lambda < 5.75$ | $32.8 \leq \theta \leq 46$ |
| $h_{Cu}/\lambda \leq 5.5$ | $5.75 \leq h_{Mo}/\lambda \leq 7.25$ | $32.2 \leq \theta \leq 46$ |

TABLE 2

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $h_{Cu}/\lambda \leq 5.5$ | $12.5 \leq h_{Mo}/\lambda < 15.5$ | $10 \leq \theta \leq 31.7$ |
| $h_{Cu}/\lambda \leq 5.5$ | $15.5 \leq h_{Mo}/\lambda < 18.5$ | $13.4 \leq \theta \leq 34.1$ |
| $h_{Cu}/\lambda \leq 5.5$ | $18.5 \leq h_{Mo}/\lambda < 21.5$ | $15.9 \leq \theta \leq 35.3$ |
| $h_{Cu}/\lambda \leq 5.5$ | $21.5 \leq h_{Mo}/\lambda \leq 24.5$ | $17.4 \leq \theta \leq 36.2$ |

TABLE 3

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $5.5 < h_{Cu}/\lambda \leq 8.5$ | $0 < -0.8 \times h_{Cu}/\lambda + 1.8 \leq h_{Mo}/\lambda < 2.75$ | $32.8 \leq \theta \leq 46$ |
| $5.5 < h_{Cu}/\lambda \leq 8.5$ | $2.75 \leq h_{Mo}/\lambda \leq 4.25$ | $32 \leq \theta \leq 46$ |

TABLE 4

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $5.5 < h_{Cu}/\lambda \leq 8.5$ | $9.5 \leq h_{Mo}/\lambda < 12.5$ | $10 \leq \theta \leq 31.2$ |
| $5.5 < h_{Cu}/\lambda \leq 8.5$ | $12.5 \leq h_{Mo}/\lambda < 15.5$ | $15.2 \leq \theta \leq 34$ |
| $5.5 < h_{Cu}/\lambda \leq 8.5$ | $15.5 \leq h_{Mo}/\lambda < 18.5$ | $16.3 \leq \theta \leq 35.2$ |
| $5.5 < h_{Cu}/\lambda \leq 8.5$ | $18.5 \leq h_{Mo}/\lambda < 21.5$ | $16.8 \leq \theta \leq 36$ |
| $5.5 < h_{Cu}/\lambda \leq 8.5$ | $21.5 \leq h_{Mo}/\lambda \leq 24.5$ | $17.5 \leq \theta \leq 37$ |

TABLE 5

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $8.5 < h_{Cu}/\lambda \leq 11.5$ | $0 < -0.8 \times h_{Cu}/\lambda + 1.8 \leq h_{Mo}/\lambda < 2.75$ | $31.8 \leq \theta \leq 46$ |

TABLE 6

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $8.5 < h_{Cu}/\lambda \leq 11.5$ | $6.5 \leq h_{Mo}/\lambda < 9.5$ | $10 \leq \theta \leq 31.2$ |
| $8.5 < h_{Cu}/\lambda \leq 11.5$ | $9.5 \leq h_{Mo}/\lambda < 12.5$ | $12.2 \leq \theta \leq 33.8$ |
| $8.5 < h_{Cu}/\lambda \leq 11.5$ | $12.5 \leq h_{Mo}/\lambda < 15.5$ | $14.2 \leq \theta \leq 35$ |
| $8.5 < h_{Cu}/\lambda \leq 11.5$ | $15.5 \leq h_{Mo}/\lambda < 18.5$ | $15.5 \leq \theta \leq 36$ |
| $8.5 < h_{Cu}/\lambda \leq 11.5$ | $18.5 \leq h_{Mo}/\lambda < 21.5$ | $15.9 \leq \theta \leq 36.8$ |
| $8.5 < h_{Cu}/\lambda \leq 11.5$ | $21.5 \leq h_{Mo}/\lambda \leq 24.5$ | $16.3 \leq \theta \leq 37.8$ |

In an elastic wave device according to another preferred embodiment of the present invention, the first electrode layer includes W as the main component, and when a wave length which is defined by an electrode finger pitch of the IDT electrode is λ and a film thickness of the first electrode layer and a film thickness of the second electrode layer, which are normalized by the wave length λ, are $h_W/\lambda$(%) and $h_{Cu}/\lambda$(%), respectively, an equation is satisfied:

$$h_W/\lambda \geq -0.3343 \times h_{Cu}/\lambda + 0.7879.$$

In this case, the fractional bandwidth is able to be effectively and stably increased. Therefore, a trade-off relationship between the frequency temperature characteristic and the fractional bandwidth is able to be further improved.

In an elastic wave device according to another preferred embodiment of the present invention, the first electrode layer includes W as the main component, and when a wave length which is defined by an electrode finger pitch of the IDT electrode is λ and a film thickness of the first electrode layer, which is normalized by the wave length λ, is $h_W/\lambda$(%), the film thickness $h_W/\lambda$ of the first electrode layer is equal to or lower than about 30%. In this case, an increase in a stress of the first electrode layer is able to be reduced or prevented and the piezoelectric substrate will not be easily damaged.

In an elastic wave device according to another preferred embodiment of the present invention, the first electrode layer includes W as the main component, Euler Angles (φ, θ, ψ) of the piezoelectric substrate are Euler Angles (0°±5°, θ, 0°±5°), and when a wave length which is defined by an electrode finger pitch of the IDT electrode is λ and a film thickness of the first electrode layer and a film thickness of the second electrode layer, which are normalized by the wave length λ, are $h_W/\lambda$(%) and $h_{Cu}/\lambda$(%), respectively, a combination of the film thickness $h_W/\lambda$ of the first electrode layer, the film thickness $h_{Cu}/\lambda$ of the second electrode layer, and θ in the Euler Angles (φ, θ, ψ) of the piezoelectric substrate is any one of combinations indicated in Table 7 to Table 12. In this case, a spurious SH wave is able to be reduced or prevented.

TABLE 7

| FILM THICKNESS OF SECOND ELECTRODE LAYER $h_{Cu}/\lambda$ (%) | FILM THICKNESS OF FIRST ELECTRODE LAYER $h_W/\lambda$ (%) | θ (°) |
|---|---|---|
| $h_{Cu}/\lambda \leq 5.5$ | $0 < -0.3343 \times h_{Cu}/\lambda + 0.7879 \leq h_W/\lambda < 1.25$ | $34.7 \leq \theta \leq 40.7$ |
| $h_{Cu}/\lambda \leq 5.5$ | $1.25 \leq h_W/\lambda < 1.75$ | $33.8 \leq \theta \leq 43$ |
| $h_{Cu}/\lambda \leq 5.5$ | $1.75 \leq h_W/\lambda < 2.25$ | $33.2 \leq \theta \leq 46$ |
| $h_{Cu}/\lambda \leq 5.5$ | $2.25 \leq h_W/\lambda < 2.75$ | $32.6 \leq \theta \leq 46$ |
| $h_{Cu}/\lambda \leq 5.5$ | $2.75 \leq h_W/\lambda < 3.25$ | $32 \leq \theta \leq 46$ |
| $h_{Cu}/\lambda \leq 5.5$ | $3.25 \leq h_W/\lambda \leq 3.75$ | $31.7 \leq \theta \leq 46$ |

TABLE 8

| FILM THICKNESS OF SECOND ELECTRODE LAYER $h_{Cu}/\lambda$ (%) | FILM THICKNESS OF FIRST ELECTRODE LAYER $h_W/\lambda$ (%) | θ (°) |
|---|---|---|
| $h_{Cu}/\lambda \leq 5.5$ | $4 \leq h_W/\lambda < 6$ | $10 \leq \theta \leq 29.5$ |
| $h_{Cu}/\lambda \leq 5.5$ | $6 \leq h_W/\lambda < 7$ | $15.7 \leq \theta \leq 32.2$ |
| $h_{Cu}/\lambda \leq 5.5$ | $7 \leq h_W/\lambda \leq 8$ | $18.5 \leq \theta \leq 34.5$ |

TABLE 9

| FILM THICKNESS OF SECOND ELECTRODE LAYER $h_{Cu}/\lambda$ (%) | FILM THICKNESS OF FIRST ELECTRODE LAYER $h_W/\lambda$ (%) | θ (°) |
|---|---|---|
| $5.5 < h_{Cu}/\lambda \leq 8.5$ | $0 < -0.3343 \times h_{Cu}/\lambda + 0.7879 \leq h_W/\lambda < 0.75$ | $33.3 \leq \theta \leq 46$ |
| $5.5 < h_{Cu}/\lambda \leq 8.5$ | $0.75 \leq h_W/\lambda < 1.25$ | $32.8 \leq \theta \leq 46$ |
| $5.5 < h_{Cu}/\lambda \leq 8.5$ | $1.25 \leq h_W/\lambda < 1.75$ | $32.2 \leq \theta \leq 46$ |
| $5.5 < h_{Cu}/\lambda \leq 8.5$ | $1.75 \leq h_W/\lambda < 2.25$ | $31.6 \leq \theta \leq 46$ |
| $5.5 < h_{Cu}/\lambda \leq 8.5$ | $2.25 \leq h_W/\lambda \leq 2.75$ | $31 \leq \theta \leq 46$ |

TABLE 10

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
|---|---|---|
| $5.5 < h_{Cu}/\lambda \leq 8.5$ | $4.5 \leq h_{Pt}/\lambda < 5.25$ | $12.7 \leq \theta \leq 31.3$ |
| $5.5 < h_{Cu}/\lambda \leq 8.5$ | $5.25 \leq h_{Pt}/\lambda < 6$ | $16.2 \leq \theta \leq 32.6$ |
| $5.5 < h_{Cu}/\lambda \leq 8.5$ | $6 \leq h_{Pt}/\lambda < 7$ | $19 \leq \theta \leq 34.3$ |
| $5.5 < h_{Cu}/\lambda \leq 8.5$ | $7 \leq h_{Pt}/\lambda \leq 8$ | $19.8 \leq \theta \leq 35.2$ |

TABLE 11

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
|---|---|---|
| $8.5 < h_{Cu}/\lambda \leq 11.5$ | $0 < -0.3343 \times h_{Cu}/\lambda + 0.7879 \leq h_{Pt}/\lambda < 0.75$ | $31.8 \leq \theta \leq 46$ |
| $8.5 < h_{Cu}/\lambda \leq 11.5$ | $0.75 \leq h_{Pt}/\lambda < 1.25$ | $31 \leq \theta \leq 46$ |
| $8.5 < h_{Cu}/\lambda \leq 11.5$ | $1.25 \leq h_{Pt}/\lambda < 1.75$ | $30 \leq \theta \leq 46$ |
| $8.5 < h_{Cu}/\lambda \leq 11.5$ | $1.75 \leq h_{Pt}/\lambda \leq 2.25$ | $27 \leq \theta \leq 46$ |

TABLE 12

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
|---|---|---|
| $8.5 < h_{Cu}/\lambda \leq 11.5$ | $4 \leq h_{Pt}/\lambda < 5$ | $14.3 \leq \theta \leq 31.7$ |
| $8.5 < h_{Cu}/\lambda \leq 11.5$ | $5 \leq h_{Pt}/\lambda < 6$ | $18 \leq \theta \leq 33.8$ |
| $8.5 < h_{Cu}/\lambda \leq 11.5$ | $6 \leq h_{Pt}/\lambda < 7$ | $19.2 \leq \theta \leq 34.8$ |
| $8.5 < h_{Cu}/\lambda \leq 11.5$ | $7 \leq h_{Pt}/\lambda \leq 8$ | $20.2 \leq \theta \leq 35.3$ |

In an elastic wave device according to another preferred embodiment of the present invention, when a wave length which is defined by an electrode finger pitch of the IDT electrode is λ and a film thickness of the second electrode layer, which is normalized by the wave length λ, is $h_{Cu}/\lambda$ (%), the film thickness $h_{Cu}/\lambda$ of the second electrode layer is equal to or lower than about 15%. In this case, productivity is able to be improved.

A high-frequency front end circuit according to a preferred embodiment of the present invention includes an elastic wave device according to a preferred embodiment of the present invention and a power amplifier.

A communication apparatus according to a preferred embodiment of the present invention includes the high-frequency front end circuit according to a preferred embodiment of the present invention and an RF (Radio Frequency) signal processing circuit.

The above and other elements, features, steps, characteristics and advantages of the present invention will become more apparent from the following detailed description of the preferred embodiments with reference to the attached drawings.

DETAILED DESCRIPTION OF THE
PREFERRED EMBODIMENTS

Hereinafter, the present invention will be explained by describing specific preferred embodiments of the present invention with reference to the drawings.

It should be noted that respective preferred embodiments which are described in the specification are exemplary and partial replacement or combination of components between different preferred embodiments may be made.

Figure 1:
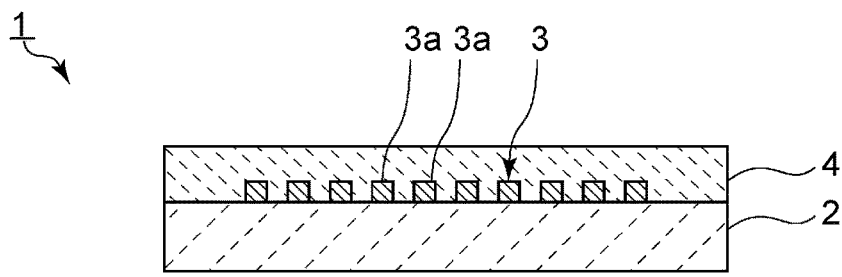
FIG. 1 is a cross-sectional front view of an elastic wave device according to a first preferred embodiment of the present invention.
Figure 2:
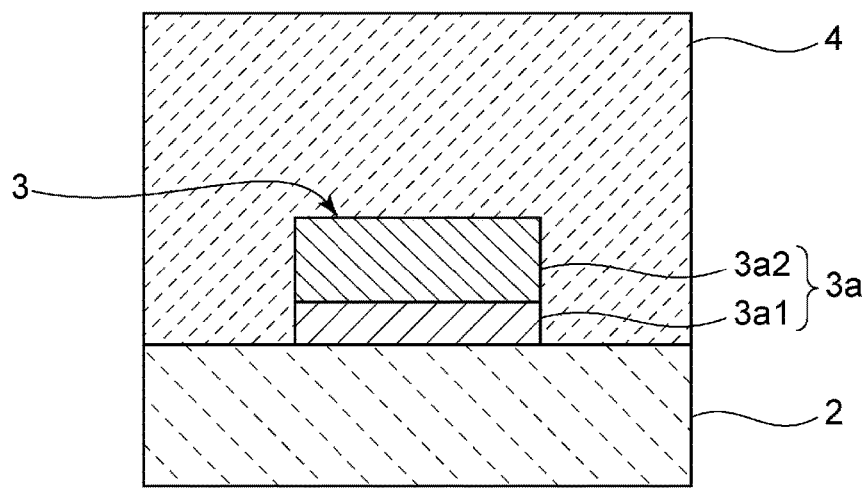
FIG. 2 is an enlarged cross-sectional front view of an electrode finger of an IDT electrode in the first preferred embodiment of the present invention.

FIG. 1 is a cross-sectional front view of an elastic wave device according to a first preferred embodiment of the present invention. FIG. 2 is an enlarged cross-sectional front view of an electrode finger of an IDT electrode in the first preferred embodiment.

An elastic wave device 1 illustrated in FIG. 1 preferably utilizes Rayleigh waves. The elastic wave device 1 includes a piezoelectric substrate 2 preferably made of lithium niobate, for example. In the present preferred embodiment, Euler Angles ($\phi$, $\theta$, $\psi$) of the piezoelectric substrate 2 are preferably Euler Angles (0°, 37.5°, 0°), for example. It should be noted that the Euler Angles ($\phi$, $\theta$, $\psi$) of the piezoelectric substrate 2 are not limited to the above-described angles.

An IDT electrode 3 is provided on the piezoelectric substrate 2. The IDT electrode 3 includes a plurality of electrode fingers 3a. A dielectric film 4 is provided on the piezoelectric substrate 2 so as to cover the IDT electrode 3. In the present preferred embodiment, the dielectric film 4 is preferably made of $SiO_2$, for example.

It should be noted that silicon oxide other than $SiO_2$ may also be used as the material of the dielectric film 4. The above-described silicon oxide is not limited to $SiO_2$ and is expressed by $SiO_x$ (x is an integer).

As illustrated in FIG. 2, the IDT electrode 3 includes a first electrode layer 3a1 and a second electrode layer 3a2. The IDT electrode 3 includes a multilayer metal film formed by laminating the first electrode layer 3a1 and the second electrode layer 3a2. In the present preferred embodiment, the first electrode layer 3a1 is provided on the piezoelectric substrate 2 and the second electrode layer 3a2 is laminated on the first electrode layer 3a1. The first electrode layer 3a1 is preferably made of Mo, for example. The second electrode layer 3a2 is preferably made of Cu, for example. It should be noted that the IDT electrode 3 may include an electrode layer other than the first and second electrode layers 3a1 and 3a2 in a range without impairing an effect of the present preferred embodiment.

When a wave length which is defined by an electrode finger pitch of the IDT electrode 3 is $\lambda$ and the film thickness of the metal layer is $h_M$, the film thickness of the metal layer, which is normalized by the wave length $\lambda$, is $T_M$. In this case, $T_M = h_M/\lambda(\%) \times 100$ is satisfied. In the specification, the film thickness of the metal layer, which is normalized by the wave length $\lambda$, is $h_M/\lambda(\%)$. The film thickness of the first electrode layer 3a1, the film thickness of the second electrode layer 3a2, and the film thickness of the dielectric film 4, which are normalized by the wave length $\lambda$, are $h_{Mo}/\lambda(\%)$, $h_{Cu}/\lambda(\%)$, and $h_S/\lambda(\%)$, respectively. In the present preferred embodiment, the film thickness $h_{Mo}/\lambda$ of the first electrode layer is preferably about 5%, for example. It should be noted that the film thickness $h_{Mo}/\lambda$ is not limited to the above-described one.

The present preferred embodiment preferably has the characteristics that the IDT electrode 3 includes the first electrode layer 3a1 made of Mo and the second electrode layer 3a2 made of Cu. Therefore, a trade-off relationship between a frequency temperature characteristic (TCV) and a fractional bandwidth is able to be improved while lowering an electrical resistance of the IDT electrode.

The improvement in the trade-off relationship between the frequency temperature characteristic (TCV) and the fractional bandwidth indicates that the TCV becomes preferable when the fractional bandwidth is the same. On the other hand, deterioration in the trade-off relationship between the frequency temperature characteristic (TCV) and the fractional bandwidth indicates that the TCV is deteriorated when the fractional bandwidth is the same.

The above-described effect will be described below by comparing the present preferred embodiment and first and second comparative examples. In the present preferred embodiment, the electrical resistance of the IDT electrode 3 is able be lowered because the second electrode layer 3a2 made of Cu with a low resistance is used. Furthermore, the fractional bandwidth is able to be efficiently improved by arranging the second electrode layer 3a2 made of Cu on the first electrode layer 3a1 made of Mo.

The first comparative example is different from the first preferred embodiment in that the second electrode layer in the IDT electrode is made of Al. The second comparative example is different from the first preferred embodiment in that the second electrode layer is made of Mg.

In the first comparative example, the film thickness of the second electrode layer, which is normalized by the wave length $\lambda$, is $h_{Al}/\lambda(\%)$. In the second comparative example, the film thickness of the second electrode layer, which is normalized by the wave length $\lambda$, is $h_{Mg}/\lambda(\%)$.

A plurality of elastic wave devices according to the first preferred embodiment and according to the first and second comparative examples were produced while varying the film thicknesses of the second electrode layers and the film thicknesses of the dielectric films. The frequency temperature characteristics (TCV) and the fractional bandwidths of the plurality of elastic wave devices described above were measured.

Figure 3:
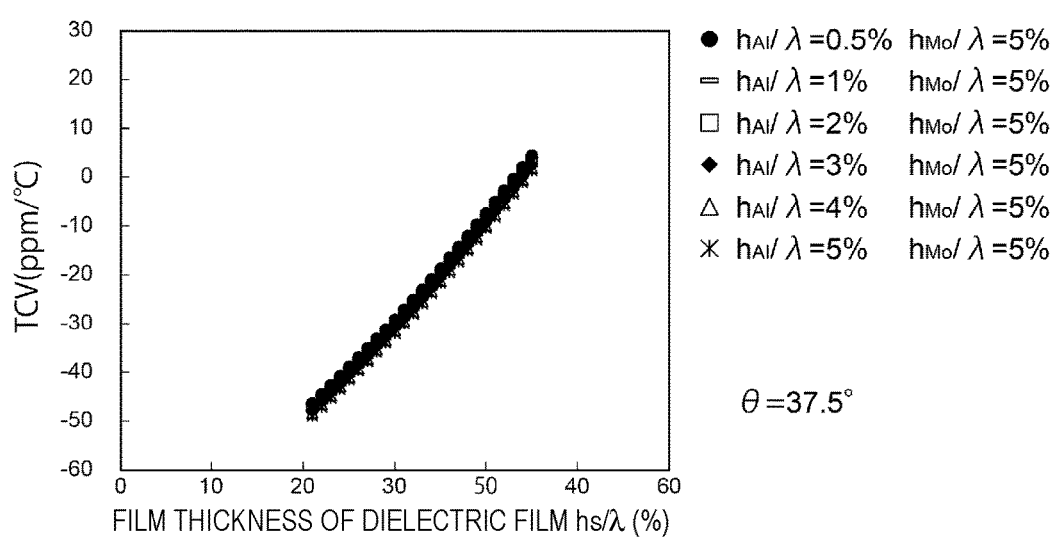
FIG. 3 is a graph indicating a relationship among a film thickness $h_S/\lambda$ of a dielectric film, a film thickness $h_{Al}/\lambda$ of a second electrode layer, and a frequency temperature characteristic (TCV) in a first comparative example.
Figure 4:
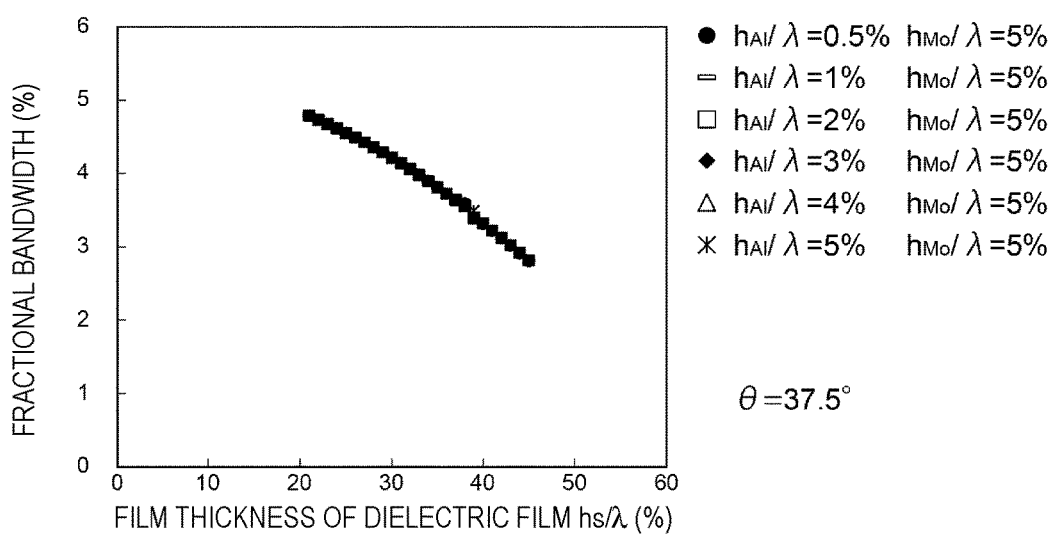
FIG. 4 is a graph indicating a relationship among the film thickness $h_S/\lambda$ of the dielectric film, the film thickness $h_{Al}/\lambda$ of the second electrode layer, and a fractional bandwidth in the first comparative example.
Figure 5:
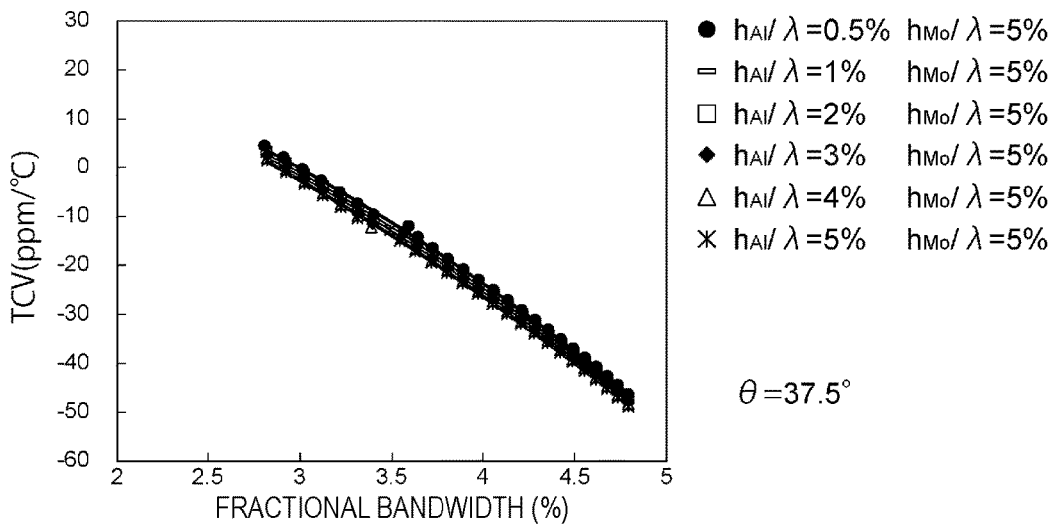
FIG. 5 is a graph indicating a relationship between a trade-off relationship between the frequency temperature characteristic (TCV) and the fractional bandwidth and the film thickness $h_{Al}/\lambda$ of the second electrode layer in the first comparative example.

FIG. 3 is a graph indicating a relationship among the film thickness $h_S/\lambda$ of the dielectric film, the film thickness $h_{Al}/\lambda$ of the second electrode layer, and the frequency temperature characteristic (TCV) in the first comparative example. FIG. 4 is a graph indicating a relationship among the film thickness $h_S/\lambda$ of the dielectric film, the film thickness $h_{Al}/\lambda$ of the second electrode layer, and the fractional bandwidth in the first comparative example. FIG. 5 is a graph indicating a relationship between the trade-off relationship between the frequency temperature characteristic (TCV) and the fractional bandwidth and the film thickness $h_{Al}/\lambda$ of the second electrode layer in the first comparative example. In the first comparative example, the film thickness $h_{Al}/\lambda$ of the second electrode layer is set to about 0.5%, about 1%, about 2%, about 3%, about 4%, and about 5%.

As illustrated in FIG. 3, it was determined that as the film thickness $h_{Al}/\lambda$ of the second electrode layer is increased, an absolute value of the frequency temperature characteristic (TCV) is increased and the frequency temperature characteristic is deteriorated when the film thickness $h_s/\lambda$ of the dielectric film is the same in the first comparative example. On the other hand, as illustrated in FIG. 4, it was determined that even when the film thickness $h_{Al}/\lambda$ of the second electrode layer is varied, values of the fractional bandwidth are substantially the same and the fractional bandwidth does not vary substantially. Therefore, as illustrated in FIG. 5, as the film thickness $h_{Al}/\lambda$ of the second electrode layer is increased, the frequency temperature characteristic (TCV) is deteriorated when the fractional bandwidth is the same. As described above, in the first comparative example in which the second electrode layer is made of Al, as the film thickness $h_{Al}/\lambda$ of the second electrode layer is increased, the trade-off relationship is deteriorated.

Figure 6:
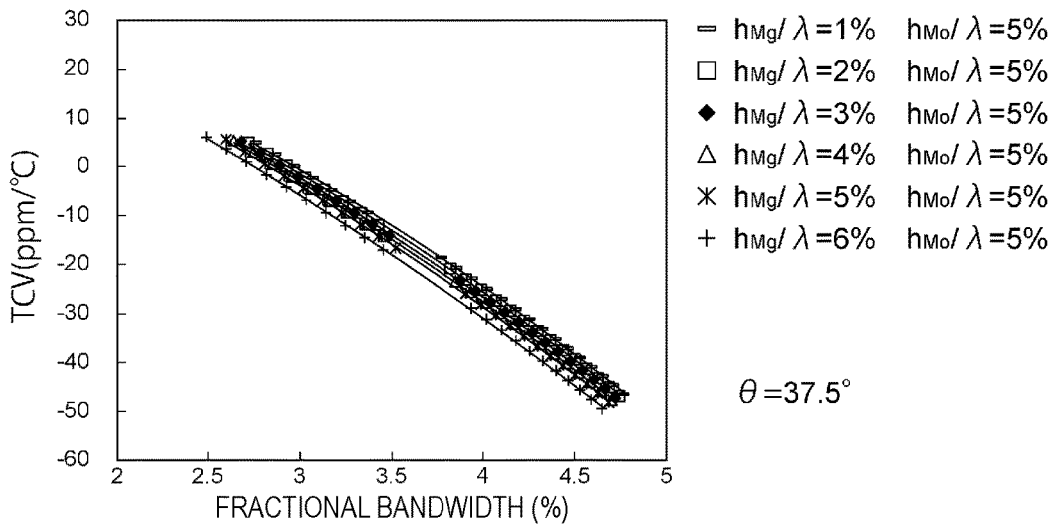
FIG. 6 is a graph indicating a relationship between the trade-off relationship between the frequency temperature characteristic (TCV) and the fractional bandwidth and a film thickness $h_{Mg}/\lambda$ of a second electrode layer in a second comparative example.

FIG. 6 is a graph indicating a relationship between the trade-off relationship between the frequency temperature characteristic (TCV) and the fractional bandwidth and the film thickness $h_{Mg}/\lambda$ of the second electrode layer in the second comparative example. In the second comparative example, the film thickness $h_{Mg}/\lambda$ of the second electrode layer is set to about 1%, about 2%, about 3%, about 4%, about 5%, and about 6%.

As illustrated in FIG. 6, it was determined that also in the second comparative example in which the second electrode layer is made of Mg, as the film thickness $h_{Mg}/\lambda$ of the second electrode layer is increased, the trade-off relationship between the frequency temperature characteristic (TCV) and the fractional bandwidth is deteriorated as in the first comparative example.

In the first preferred embodiment, the trade-off relationship between the frequency temperature characteristic (TCV) and the fractional bandwidth is improved because the second electrode layer is preferably made of Cu. This effect is described with reference to FIG. 7 to FIG. 10 below.

Figure 7:
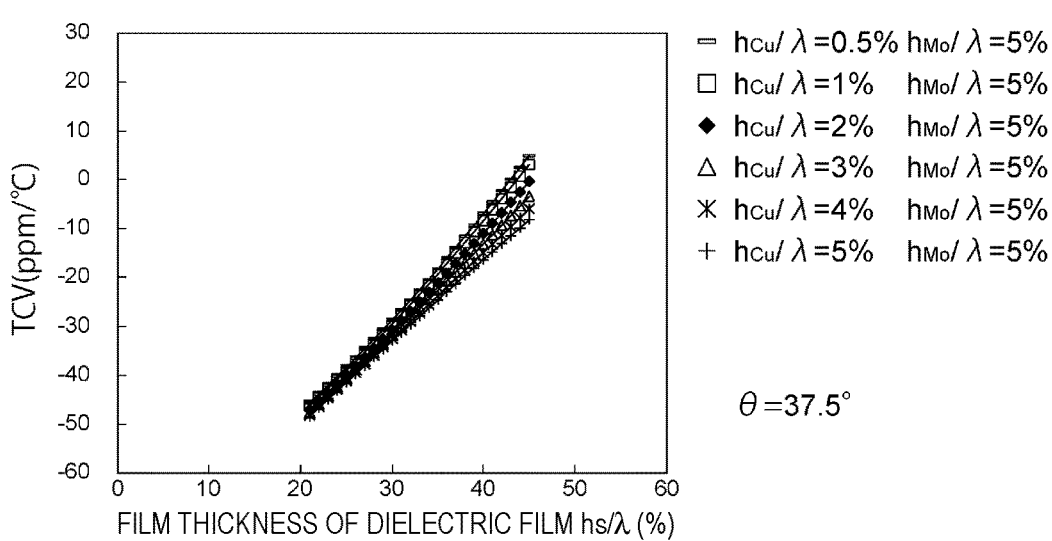
FIG. 7 is a graph indicating a relationship among the film thickness $h_S/\lambda$ of the dielectric film, a film thickness $h_{Cu}/\lambda$ of a second electrode layer, and the frequency temperature characteristic (TCV) in the first preferred embodiment of the present invention.
Figure 8:
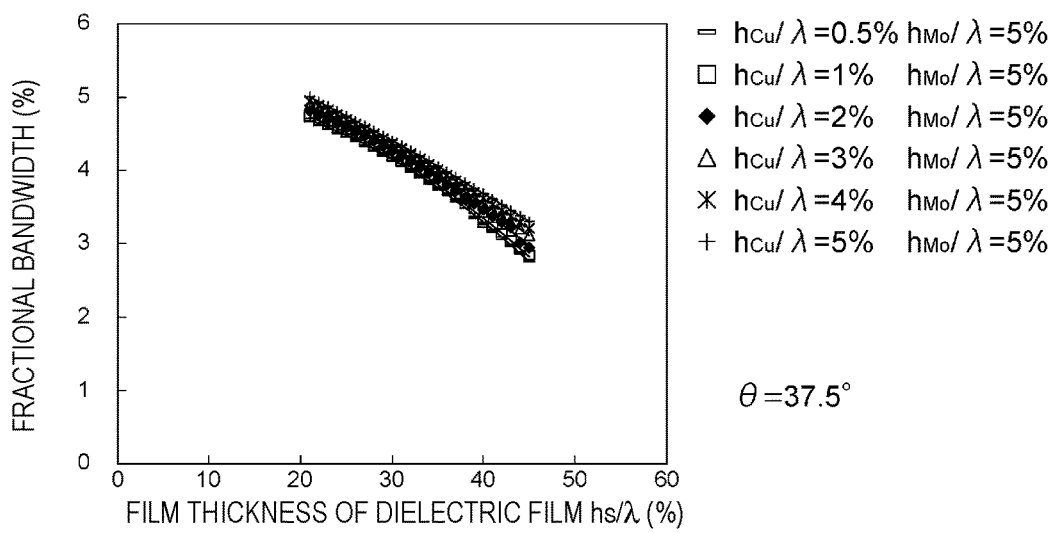
FIG. 8 is a graph indicating a relationship among the film thickness $h_S/\lambda$ of the dielectric film, the film thickness $h_{Cu}/\lambda$ of the second electrode layer, and the fractional bandwidth in the first preferred embodiment of the present invention.
Figure 9:
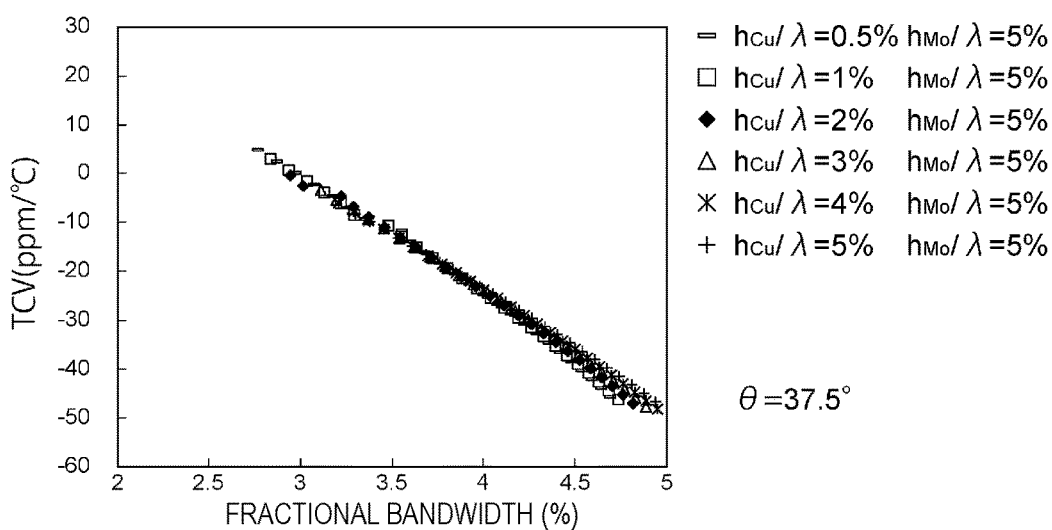
FIG. 9 is a graph indicating a relationship between the trade-off relationship between the frequency temperature characteristic (TCV) and the fractional bandwidth and the film thickness $h_{Cu}/\lambda$ of the second electrode layer in the first preferred embodiment of the present invention.

FIG. 7 is a graph indicating a relationship among the film thickness $h_s/\lambda$ of the dielectric film, the film thickness $h_{Cu}/\lambda$ of the second electrode layer, and the frequency temperature characteristic (TCV) in the first preferred embodiment. FIG. 8 is a graph indicating a relationship among the film thickness $h_s/\lambda$ of the dielectric film, the film thickness $h_{Cu}/\lambda$ of the second electrode layer, and the fractional bandwidth in the first preferred embodiment. FIG. 9 is a graph indicating a relationship between the trade-off relationship between the frequency temperature characteristic (TCV) and the fractional bandwidth and the film thickness $h_{Cu}/\lambda$ of the second electrode layer in the first preferred embodiment. In the first preferred embodiment, the film thickness $h_{Cu}/\lambda$ of the second electrode layer is set to about 0.5%, about 1%, about 2%, about 3%, about 4%, and about 5%.

As illustrated in FIG. 7, in the first preferred embodiment, as the film thickness $h_{Cu}/\lambda$ of the second electrode layer is increased, the frequency temperature characteristic (TCV) is deteriorated when the film thickness $h_s/\lambda$ of the dielectric film is the same. As illustrated in FIG. 8, however, it was determined that as the film thickness $h_{Cu}/\lambda$ of the second electrode layer is increased, the fractional bandwidth is increased when the film thickness $h_s/\lambda$ of the dielectric film is the same. That is to say, usage of Cu for the second electrode layer provides an effect that the fractional bandwidth is increased although the frequency temperature characteristic (TCV) is deteriorated. As illustrated in FIG. 9, it was determined that as the film thickness $h_{Cu}/\lambda$ of the second electrode layer is increased, the frequency temperature characteristic (TCV) is improved when the fractional bandwidth is the same. As described above, the trade-off relationship between the frequency temperature characteristic (TCV) and the fractional bandwidth is improved in the first preferred embodiment.

Figure 10:
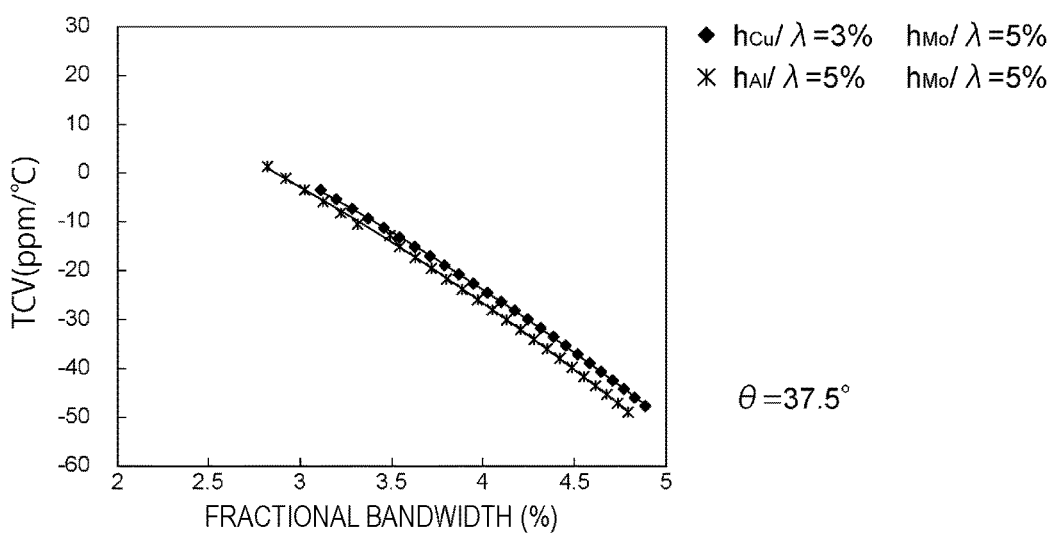
FIG. 10 is a graph indicating the trade-off relationships between the frequency temperature characteristic (TCV) and the fractional bandwidth in the first preferred embodiment of the present invention and the first comparative example.

FIG. 10 is a graph indicating the trade-off relationships between the frequency temperature characteristic (TCV) and the fractional bandwidth in the first preferred embodiment and the first comparative example. FIG. 10 indicates a result when the film thickness $h_{Cu}/\lambda$ of the second electrode layer is about 3% in the first preferred embodiment and a result when the film thickness $h_{Al}/\lambda$ of the second electrode layer is about 5% in the first comparative example.

As illustrated in FIG. 10, it was determined that the fractional bandwidth in the first preferred embodiment is higher than the fractional bandwidth in the first comparative example when the frequency temperature characteristic (TCV) is the same. In the first preferred embodiment, the second electrode layer is preferably made of Cu. The second electrode layer therefore has an electrical resistance which is sufficiently lower than that of the first electrode layer made of Mo. Accordingly, the trade-off relationship between the frequency temperature characteristic (TCV) and the fractional bandwidth is improved and the electrical resistance of the IDT electrode is effectively lowered by increasing the film thickness $h_{Cu}/\lambda$ of the second electrode layer.

A second preferred embodiment of the present invention will be described below.

An elastic wave device according to the second preferred embodiment is different from that according to the first preferred embodiment in a relationship between the film thickness $h_{Mo}/\lambda$ of the first electrode layer and the film thickness $h_{Cu}/\lambda$ of the second electrode layer. The elastic wave device in the second preferred embodiment preferably has the same or substantially the same configurations as those of the elastic wave device 1 in the first preferred embodiment illustrated in FIG. 1 other than the above-described point.

To be more specific, in the present preferred embodiment, the film thickness $h_{Mo}/\lambda$ of the first electrode layer and the film thickness $h_{Cu}/\lambda$ of the second electrode layer have a relationship of the following equation 1.

$$h_{Mo}/\lambda \geq -0.8 \times h_{Cu}/\lambda + 1.8 \quad \text{(Equation 1)}.$$

Energy of elastic waves is able to be effectively confined in the surface of the piezoelectric substrate by satisfying the above-described equation 1. This confinement effectively increases the fractional bandwidth to further improve the trade-off relationship between the frequency temperature characteristic (TCV) and the fractional bandwidth. This effect will be described below.

Figure 11:
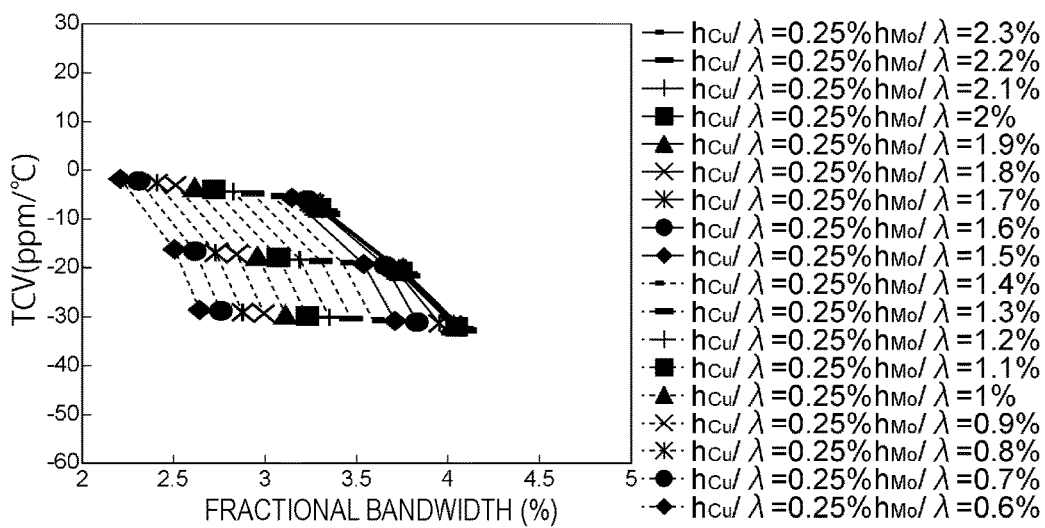
FIG. 11 is a graph indicating a relationship between the trade-off relationship between the frequency temperature characteristic (TCV) and the fractional bandwidth and a film thickness $h_{Mo}/\lambda$ of a first electrode layer when the film thickness $h_{Cu}/\lambda$ of the second electrode layer is about 0.25%.
Figure 12:
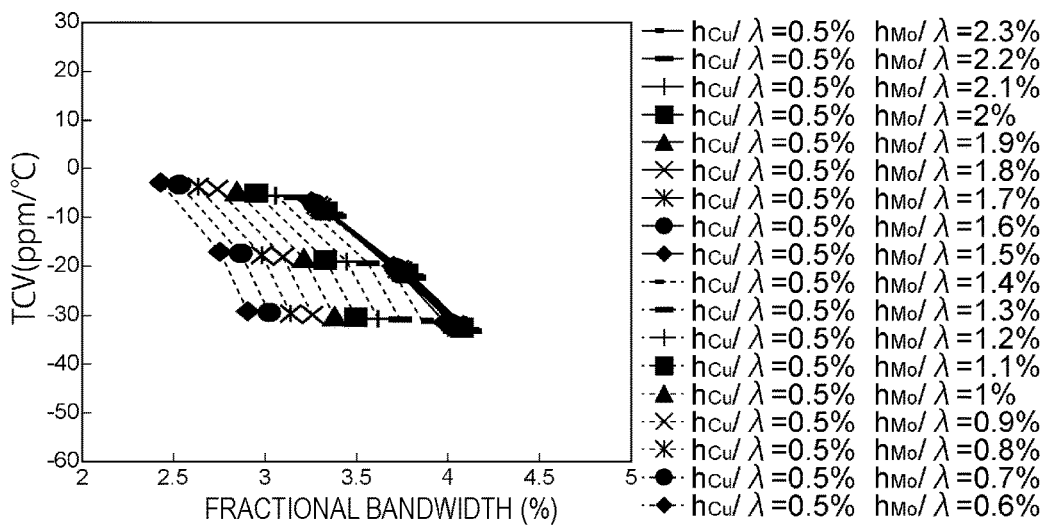
FIG. 12 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 0.5%.
Figure 13:
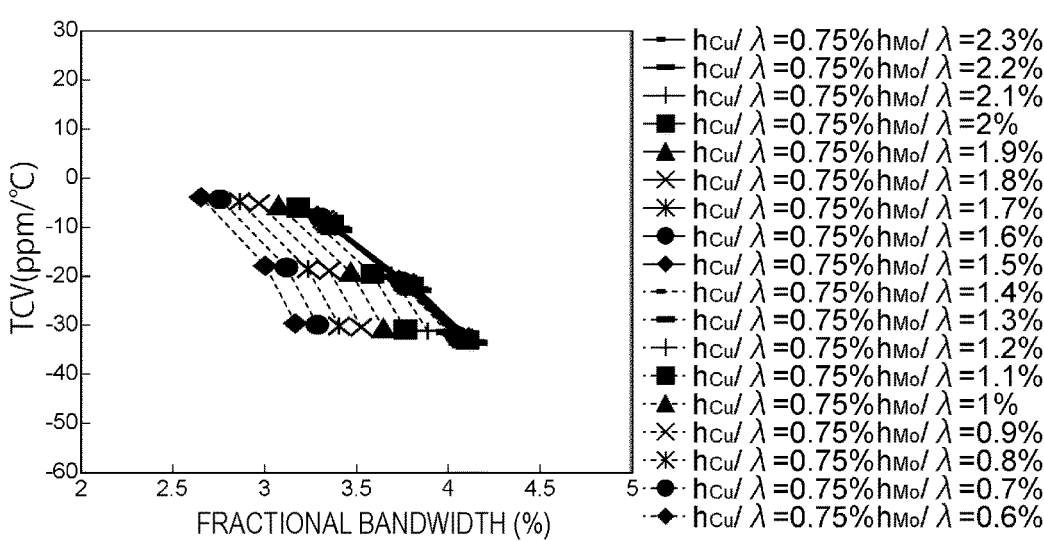
FIG. 13 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 0.75%.
Figure 14:
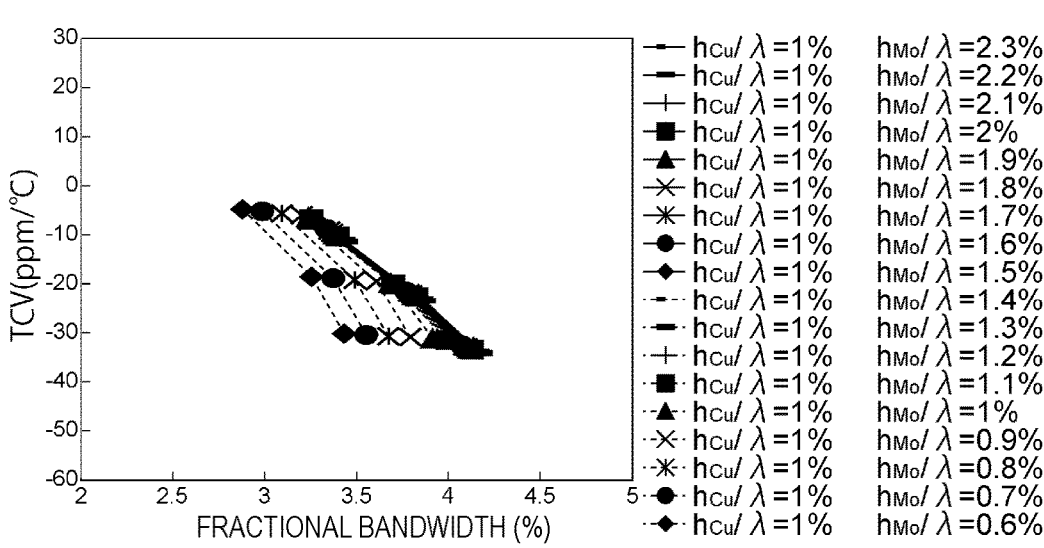
FIG. 14 is a graph indicating a relationship between the trade-off relationship between the frequency temperature characteristics (TCV) and the fractional bandwidth and the film thickness $h_{Mo}/\lambda$ of the first electrode layer when the film thickness $h_{Cu}/\lambda$ of the second electrode layer is about 1%.
Figure 15:
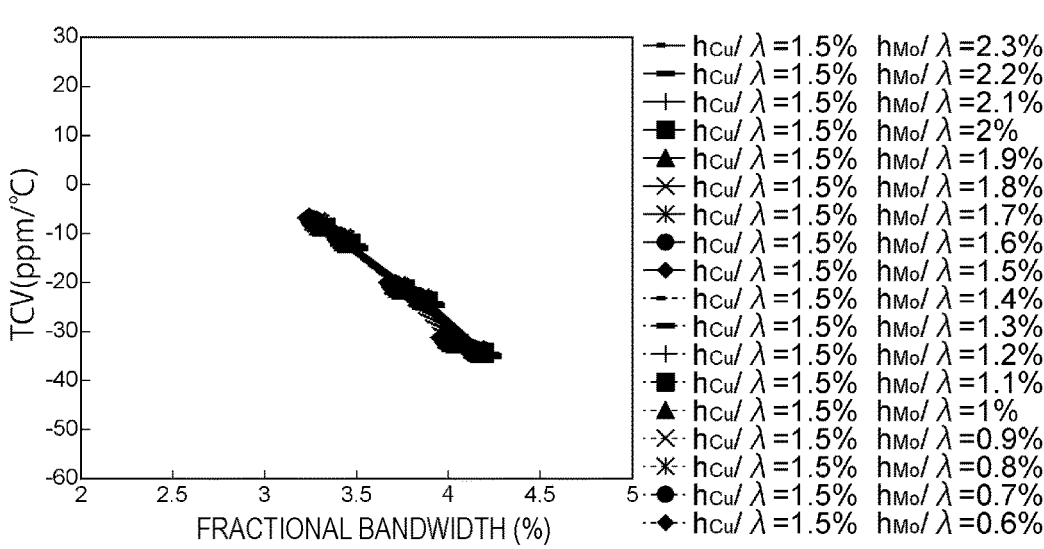
FIG. 15 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 1.5%.

FIG. 11 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 0.25%. FIG. 12 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 0.5%. FIG. 13 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 0.75%. FIG. 14 is a graph indicating a relationship between the trade-off relationship between the frequency temperature characteristics (TCV) and the fractional bandwidth and the film thickness $h_{Mo}/\lambda$ of the first electrode layer when the film thickness $h_{Cu}/\lambda$ of the second electrode layer is about 1%. FIG. 15 is a graph indicating a relationship between the trade-off relationship between the frequency temperature characteristic (TCV) and the fractional bandwidth and the film thickness $h_{Mo}/\lambda$ of the first electrode layer when the film thickness $h_{Cu}/\lambda$ of the second electrode layer is about 1.5%.

As illustrated in FIG. 11, as the film thickness $h_{Mo}/\lambda$ of the first electrode layer is increased, the fractional bandwidth is increased when the frequency temperature characteristic (TCV) is the same. Therefore, it was determined that the trade-off relationship between the frequency temperature characteristic (TCV) and the fractional bandwidth is improved. In particular, it was determined that under the condition in which the film thickness $h_{Mo}/\lambda$ of the first electrode layer is higher than about 1.6%, variation in the fractional bandwidth relative to the film thickness $h_{Mo}/\lambda$ is significantly decreased. In the same or similar manner, as illustrated in FIG. 12 to FIG. 15, also in the cases in which the film thickness $h_{Cu}/\lambda$ of the second electrode layer is about 0.5% to 1.5%, as the film thickness $h_{Mo}/\lambda$ of the first electrode layer is increased, the above-described trade-off relationship is further improved. Furthermore, it has been determined that under the condition in which the film thickness $h_{Mo}/\lambda$ is higher than a certain value, variation in the fractional bandwidth is significantly decreased by increasing the film thickness $h_{Mo}/\lambda$ to be higher than the certain value.

In order to provide the film thickness $h_{Mo}/\lambda$ of the first electrode layer with which the increased fractional bandwidth is stably provided, relationships between the film thickness $h_{Mo}/\lambda$ of the first electrode layer and the fractional bandwidth when the frequency temperature characteristic (TCV) was about −20 ppm/° C. in the cases in which the film thickness $h_{Cu}/\lambda$ of the second electrode layer was about 0.25%, about 0.5%, about 0.75%, about 1%, and about 1.5% were respectively calculated from FIG. 11 to FIG. 15.

Figure 16:
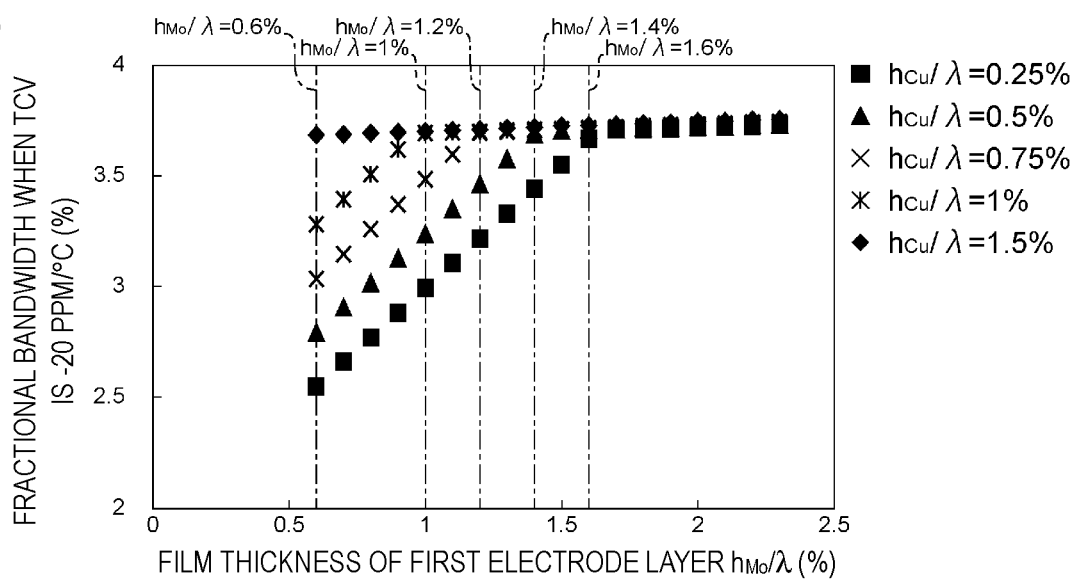
FIG. 16 is a graph indicating a relationship among the film thickness $h_{Mo}/\lambda$ of the first electrode layer, the film thickness $h_{Cu}/\lambda$ of the second electrode layer, and the fractional bandwidth when the frequency temperature characteristic (TCV) is about −20 ppm/° C.

FIG. 16 is a graph indicating a relationship among the film thickness $h_{Mo}/\lambda$ of the first electrode layer, the film thickness $h_{Cu}/\lambda$ of the second electrode layer, and the fractional bandwidth when the frequency temperature characteristic (TCV) is about −20 ppm/° C.

As illustrated in FIG. 16, in the case in which the film thickness $h_{Cu}/\lambda$ of the second electrode layer is about 0.25%, when the film thickness $h_{Mo}/\lambda$ of the first electrode layer is equal to or higher than about 1.6%, the fractional bandwidth is effectively and stably increased. Therefore, the above-described trade-off relationship is further improved. In the same or similar manner, in the case in which the film thickness $h_{Cu}/\lambda$ of the second electrode layer is about 0.5%, when the film thickness $h_{Mo}/\lambda$ of the first electrode layer is equal to or higher than about 1.4%, the fractional bandwidth is effectively and stably increased and the above-described trade-off relationship is further improved. In the case in which the film thickness $h_{Cu}/\lambda$ of the second electrode layer is about 0.75%, when the film thickness $h_{Mo}/\lambda$ of the first electrode layer is equal to or higher than about 1.2%, the fractional bandwidth is effectively and stably increased and the above-described trade-off relationship is further improved. In the case in which the film thickness $h_{Cu}/\lambda$ of the second electrode layer is about 1%, when the film thickness $h_{Mo}/\lambda$ of the first electrode layer is equal to or higher than about 1.0%, the fractional bandwidth is effectively and stably increased and the above-described trade-off relationship is further improved in comparison to the case in which the film thickness $h_{Mo}/\lambda$ of the first electrode layer is lower than about 1.0%. In the case in which the film thickness $h_{Cu}/\lambda$ of the second electrode layer is about 1.5%, when the film thickness $h_{Mo}/\lambda$ of the first electrode layer is equal to or higher than about 0.6%, the fractional bandwidth is effectively and stably increased and the above-described trade-off relationship is further improved.

The relationship between the film thickness $h_{Cu}/\lambda$ of the second electrode layer and the film thickness $h_{Mo}/\lambda$ of the first electrode layer with which the fractional bandwidth is stably increased was obtained from FIG. 16.

Figure 17:
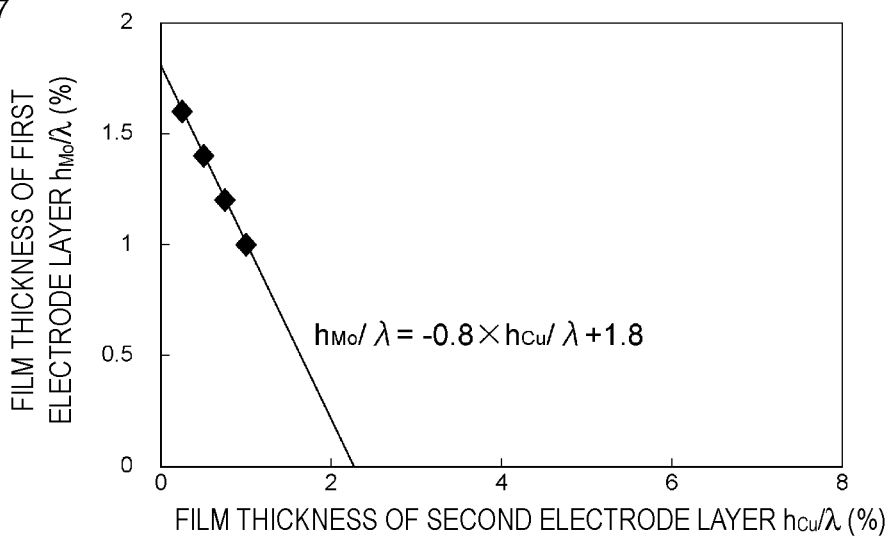
FIG. 17 is a graph indicating a relationship between the film thickness $h_{Cu}/\lambda$ of the second electrode layer and the film thickness $h_{Mo}/\lambda$ of the first electrode layer with which the fractional bandwidth can be increased stably.

FIG. 17 is a graph indicating the relationship between the film thickness $h_{Cu}/\lambda$ of the second electrode layer and the film thickness $h_{Mo}/\lambda$ of the first electrode layer with which the fractional bandwidth is stably increased.

As illustrated in FIG. 17, when the film thickness $h_{Mo}/\lambda$ of the first electrode layer and the film thickness $h_{Cu}/\lambda$ of the second electrode layer have the relationship of the above-described equation 1, the fractional bandwidth is able to be stably increased. Accordingly, the trade-off relationship between the frequency temperature characteristic (TCV) and the fractional bandwidth is further improved in the present preferred embodiment.

It is preferable that the film thickness $h_{Mo}/\lambda$ of the first electrode layer be equal to or lower than about 30%, for example. In this case, an increase in a stress of the first electrode layer is reduced or prevented and the piezoelectric substrate will not be easily damaged. As will be described in detail later, when the first electrode layer is formed, a metal layer made of Mo is subjected to dry etching. In the dry etching, a resist is simultaneously subjected to etching. Therefore, it is difficult to form the first electrode layer having a desired shape unless patterning of the above-described metal layer is completed before the resist is completely removed. The first electrode layer is able to be formed to have a desired shape more reliably by setting the film thickness $h_{Mo}/\lambda$ of the first electrode layer to be equal to or lower than about 30%. With this, the IDT electrode is able to be more reliably formed to have a desired shape.

It is preferable that the film thickness $h_{Cu}/\lambda$ of the second electrode layer be equal to or lower than about 15%, for example. Also in this case, the IDT electrode is able to be easily formed in a manufacturing process of the elastic wave device, so as to improve productivity.

A third preferred embodiment of the present invention will be described below.

An elastic wave device according to the third preferred embodiment is different from that according to the first preferred embodiment in a relationship among the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate. The elastic wave device according to the third preferred embodiment preferably has the same or substantially the same configurations as those of the elastic wave device 1 in the first preferred embodiment illustrated in FIG. 1 other than the above-described point.

To be more specific, in the present preferred embodiment, the Euler Angles ($\phi$, $\theta$, $\psi$) of the piezoelectric substrate are preferably Euler Angles (0°, θ, 0°), for example. A combination of the film thickness $h_{Mo}/\lambda$ of the first electrode layer, the film thickness $h_{Cu}/\lambda$ of the second electrode layer, and θ in the Euler Angles (φ, θ, ψ) of the piezoelectric substrate is any one of combinations indicated in Table 1 to Table 6.

TABLE 1

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $h_{Cu}/\lambda \leq 5.5$ | $0 < -0.8 \times h_{Cu}/\lambda + 1.8 \leq h_{Mo}/\lambda < 2.75$ | $34.7 \leq \theta \leq 41.4$ |
| $h_{Cu}/\lambda \leq 5.5$ | $2.75 \leq h_{Mo}/\lambda < 4.25$ | $33.6 \leq \theta \leq 45.7$ |
| $h_{Cu}/\lambda \leq 5.5$ | $4.25 \leq h_{Mo}/\lambda < 5.75$ | $32.8 \leq \theta \leq 46$ |
| $h_{Cu}/\lambda \leq 5.5$ | $5.75 \leq h_{Mo}/\lambda \leq 7.25$ | $32.2 \leq \theta \leq 46$ |

TABLE 2

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $h_{Cu}/\lambda \leq 5.5$ | $12.5 \leq h_{Mo}/\lambda < 15.5$ | $10 \leq \theta \leq 31.7$ |
| $h_{Cu}/\lambda \leq 5.5$ | $15.5 \leq h_{Mo}/\lambda < 18.5$ | $13.4 \leq \theta \leq 34.1$ |
| $h_{Cu}/\lambda \leq 5.5$ | $18.5 \leq h_{Mo}/\lambda < 21.5$ | $15.9 \leq \theta \leq 35.3$ |
| $h_{Cu}/\lambda \leq 5.5$ | $21.5 \leq h_{Mo}/\lambda \leq 24.5$ | $17.4 \leq \theta \leq 36.2$ |

TABLE 3

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $5.5 < h_{Cu}/\lambda \leq 8.5$ | $0 < -0.8 \times h_{Cu}/\lambda + 1.8 \leq h_{Mo}/\lambda < 2.75$ | $32.8 \leq \theta \leq 46$ |
| $5.5 < h_{Cu}/\lambda \leq 8.5$ | $2.75 \leq h_{Mo}/\lambda < 4.25$ | $32 \leq \theta \leq 46$ |

TABLE 4

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $5.5 < h_{Cu}/\lambda \leq 8.5$ | $9.5 \leq h_{Mo}/\lambda < 12.5$ | $10 \leq \theta \leq 31.2$ |
| $5.5 < h_{Cu}/\lambda \leq 8.5$ | $12.5 \leq h_{Mo}/\lambda < 15.5$ | $15.2 \leq \theta \leq 34$ |
| $5.5 < h_{Cu}/\lambda \leq 8.5$ | $15.5 \leq h_{Mo}/\lambda < 18.5$ | $16.3 \leq \theta \leq 35.2$ |
| $5.5 < h_{Cu}/\lambda \leq 8.5$ | $18.5 \leq h_{Mo}/\lambda < 21.5$ | $16.8 \leq \theta \leq 36$ |
| $5.5 < h_{Cu}/\lambda \leq 8.5$ | $21.5 \leq h_{Mo}/\lambda \leq 24.5$ | $17.5 \leq \theta \leq 37$ |

TABLE 5

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $8.5 < h_{Cu}/\lambda \leq 11.5$ | $0 < -0.8 \times h_{Cu}/\lambda + 1.8 \leq h_{Mo}/\lambda < 2.75$ | $31.8 \leq \theta \leq 46$ |

TABLE 6

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | θ (°) |
|---|---|---|
| $8.5 < h_{Cu}/\lambda \leq 11.5$ | $6.5 \leq h_{Mo}/\lambda < 9.5$ | $10 \leq \theta \leq 31.2$ |
| $8.5 < h_{Cu}/\lambda \leq 11.5$ | $9.5 \leq h_{Mo}/\lambda < 12.5$ | $12.2 \leq \theta \leq 33.8$ |
| $8.5 < h_{Cu}/\lambda \leq 11.5$ | $12.5 \leq h_{Mo}/\lambda < 15.5$ | $14.2 \leq \theta \leq 35$ |
| $8.5 < h_{Cu}/\lambda \leq 11.5$ | $15.5 \leq h_{Mo}/\lambda < 18.5$ | $15.5 \leq \theta \leq 36$ |
| $8.5 < h_{Cu}/\lambda \leq 11.5$ | $18.5 \leq h_{Mo}/\lambda < 21.5$ | $15.9 \leq \theta \leq 36.8$ |
| $8.5 < h_{Cu}/\lambda \leq 11.5$ | $21.5 \leq h_{Mo}/\lambda \leq 24.5$ | $16.3 \leq \theta \leq 37.8$ |

The film thickness $h_{Mo}/\lambda$ of the first electrode layer, the film thickness $h_{Cu}/\lambda$ of the second electrode layer, and the Euler Angles (φ, θ, ψ) of the piezoelectric substrate have the above-described relationship, which reduces or prevents a spurious SH wave. This effect will be described below.

Figure 18:
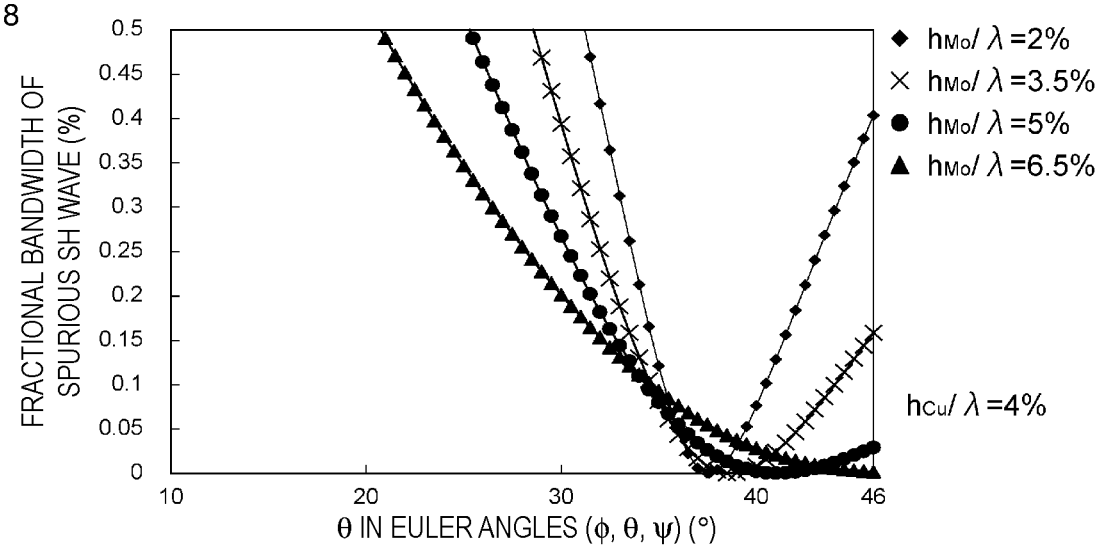
FIG. 18 is a graph indicating a relationship among the film thickness $h_{Mo}/\lambda$ of the first electrode layer, θ in Euler Angles (φ, θ, ψ), and a fractional bandwidth of a spurious SH wave when the film thickness $h_{Cu}/\lambda$ of the second electrode layer is about 4% in a third preferred embodiment of the present invention.

FIG. 18 is a graph indicating a relationship among the film thickness $h_{Mo}/\lambda$ of the first electrode layer, θ in the Euler Angles (φ, θ, ψ), and a fractional bandwidth of the spurious SH wave when the film thickness $h_{Cu}/\lambda$ of the second electrode layer is about 4% in the third preferred embodiment. θ in the Euler Angles (φ, θ, ψ) was calculated in a range of about 10° to about 46° in which the Rayleigh waves are primarily excited. FIG. 18 illustrates the cases in which the film thickness $h_{Mo}/\lambda$ of the first electrode layer is about 2%, about 3.5%, about 5%, and about 6.5%.

As illustrated in FIG. 18, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles (φ, θ, ψ) of the piezoelectric substrate as indicated in Table 13. Therefore, the spurious SH wave is effectively reduced or prevented.

Figure 19:
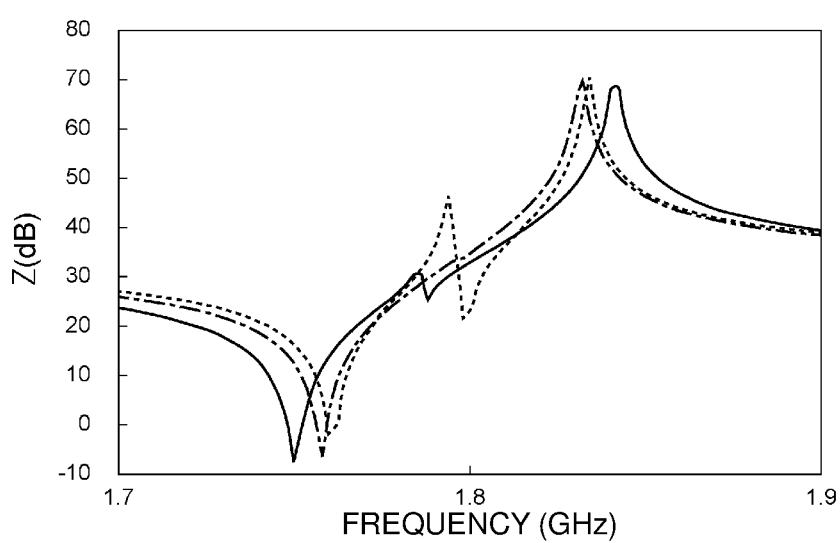
FIG. 19 is a graph indicating impedance characteristics of elastic wave devices in the third preferred embodiment of the present invention and a comparative example.

FIG. 19 below illustrates impedance characteristics of the elastic wave device in which the combination of the film thickness $h_{Mo}/\lambda$ of the first electrode layer, the film thickness $h_{Cu}/\lambda$ of the second electrode layer, and the Euler Angles (φ, θ, ψ) of the piezoelectric substrate is the combination indicated in Table 13 and an elastic wave device in a comparative example. FIG. 19 illustrates two examples of the third preferred embodiment.

FIG. 19 is a graph indicating the impedance characteristics of the elastic wave devices in the third preferred embodiment and the comparative example. In FIG. 19, a solid line indicates a result in the third preferred embodiment when the film thickness $h_{Mo}/\lambda$ of the first electrode layer is about 5%, the film thickness $h_{Cu}/\lambda$ of the second electrode layer is about 4%, and the Euler Angles (φ, θ, ψ) of the piezoelectric substrate are Euler Angles (0°, 33°, 0°). An alternate long and short dash line indicates a result in the third preferred embodiment when the film thickness $h_{Mo}/\lambda$ of the first electrode layer is about 5%, the film thickness $h_{Cu}/\lambda$ of the second electrode layer is about 4%, and the Euler Angles (φ, θ, ψ) of the piezoelectric substrate are Euler Angles (0°, 40°, 0°). A broken line indicates a result in the comparative example when the film thickness $h_{Mo}/\lambda$ of the first electrode layer is about 5%, the film thickness $h_{Cu}/\lambda$ of the second electrode layer is about 4%, and the Euler Angles (φ, θ, ψ) of the piezoelectric substrate are Euler Angles (0°, 30°, 0°).

As illustrated in FIG. 19, it was determined that a ripple caused by the SH wave occurs between a resonant frequency and an anti-resonant frequency in the comparative example.

It was determined that a fractional bandwidth of the ripple is about 0.25% and the spurious SH wave cannot be sufficiently reduced or prevented.

On the other hand, in the third preferred embodiment indicated by the solid line, the fractional bandwidth of the ripple due to the SH wave is reduced to be about 0.15%. In the third preferred embodiment indicated by the alternate long and short dash line, the above-mentioned ripple reduced to be about 0.002%. In this manner, in the third preferred embodiment, the fractional bandwidth of the spurious SH wave is effectively reduced to be equal to or lower than about 0.15%.

In addition, in the third preferred embodiment indicated by the solid line, the ripple caused by the SH wave is reduced to be about 5 dB. In the third preferred embodiment indicated by the alternate long and short dash line, the above-described ripple is reduced to be extremely low. In this manner, in the third preferred embodiment, the ripple caused by the SH wave is reduced to be equal to or lower than about 5 dB.

Figure 20:
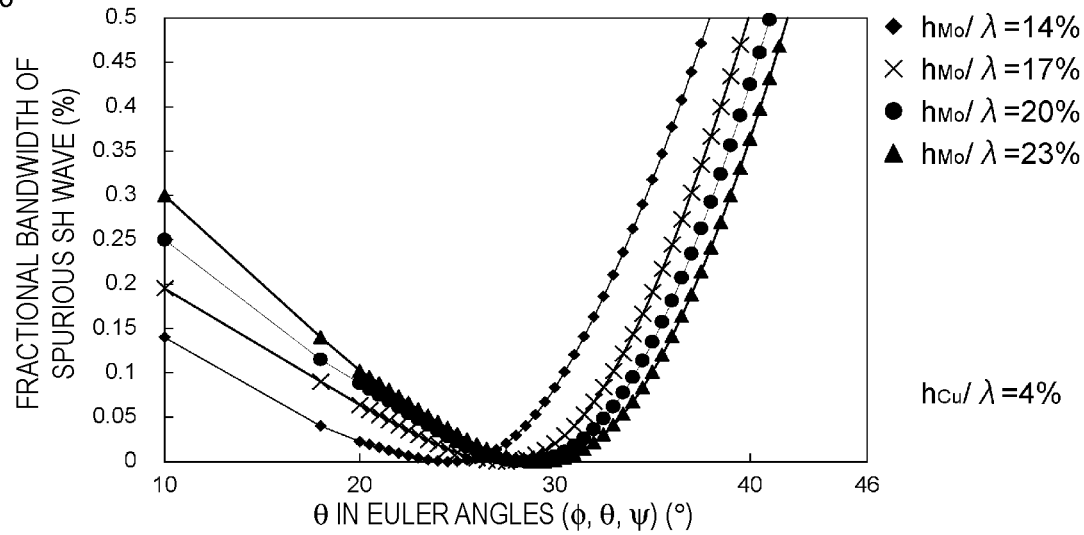
FIG. 20 is a graph indicating a relationship among the film thickness $h_{Mo}/\lambda$ of the first electrode layer, θ in the Euler Angles (φ, θ, ψ), and the fractional bandwidth of the spurious SH wave when the film thickness $h_{Cu}/\lambda$ of the second electrode layer is about 4% in the third preferred embodiment of the present invention.

FIG. 20 is a graph indicating a relationship among the film thickness $h_{Mo}/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 4% in the third preferred embodiment. FIG. 20 illustrates the cases in which the film thickness $h_{Mo}/\lambda$ of the first electrode layer is about 14%, about 17%, about 20%, and about 23%.

As illustrated in FIG. 20, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 14. Therefore, the spurious SH wave is effectively reduced or prevented.

Figure 21:
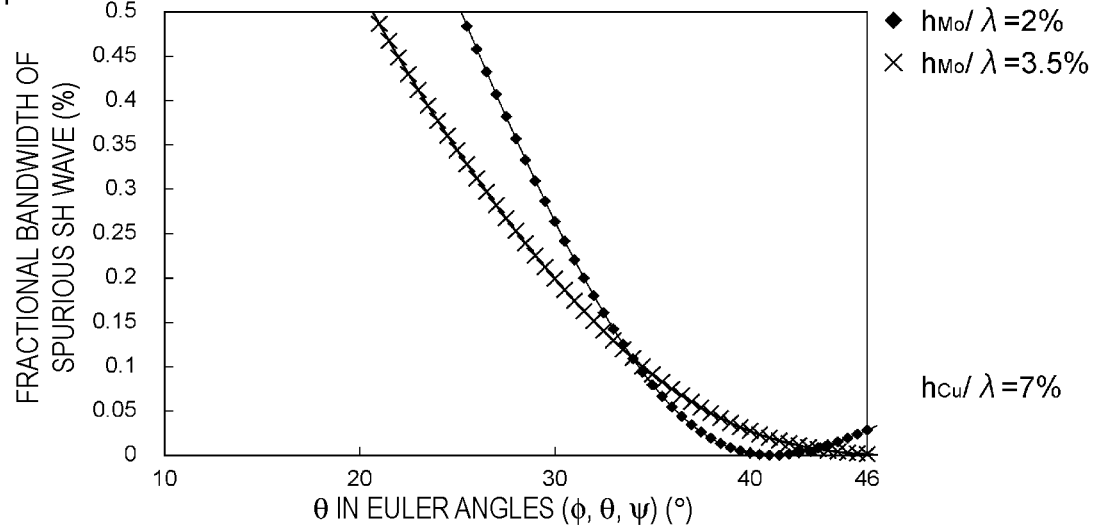
FIG. 21 is a graph indicating a relationship among the film thickness $h_{Mo}/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the third preferred embodiment of the present invention.

FIG. 21 is a graph indicating a relationship among the film thickness $h_{Mo}/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 7% in the third preferred embodiment. FIG. 21 illustrates the cases in which the film thickness $h_{Mo}/\lambda$ of the first electrode layer is about 2% and about 3.5%.

As illustrated in FIG. 21, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 15. Therefore, the spurious SH wave is effectively reduced or prevented.

Figure 22:
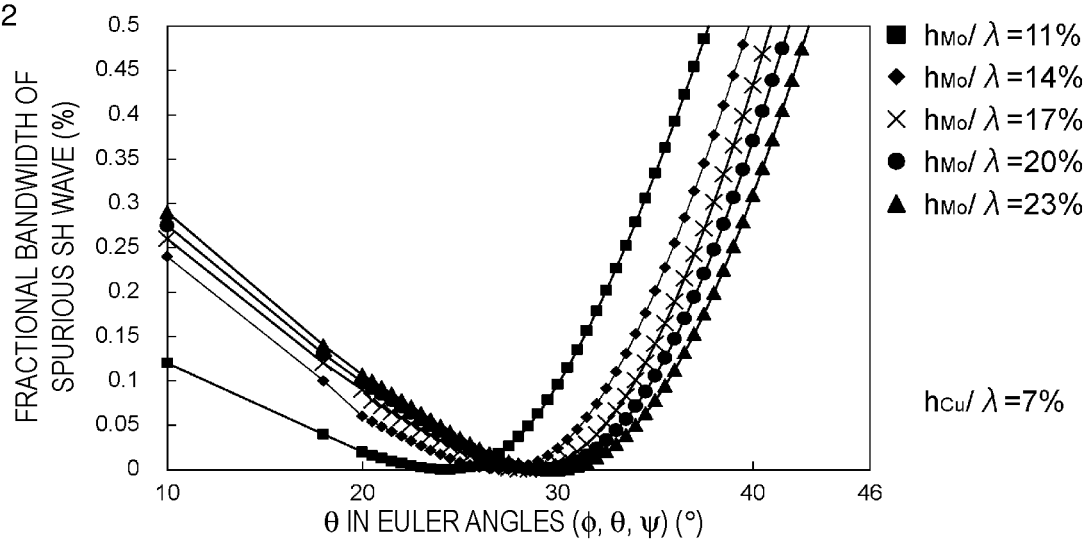
FIG. 22 is a graph indicating a relationship among the film thickness $h_{Mo}/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the third preferred embodiment of the present invention.

FIG. 22 is a graph indicating a relationship among the film thickness $h_{Mo}/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 7% in the third preferred embodiment. FIG. 22 illustrates the cases in which the film thickness $h_{Mo}/\lambda$ of the first electrode layer is about 11%, about 14%, about 17%, about 20%, and about 23%.

As illustrated in FIG. 22, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 16. Therefore, the spurious SH wave is effectively reduced or prevented.

Figure 23:
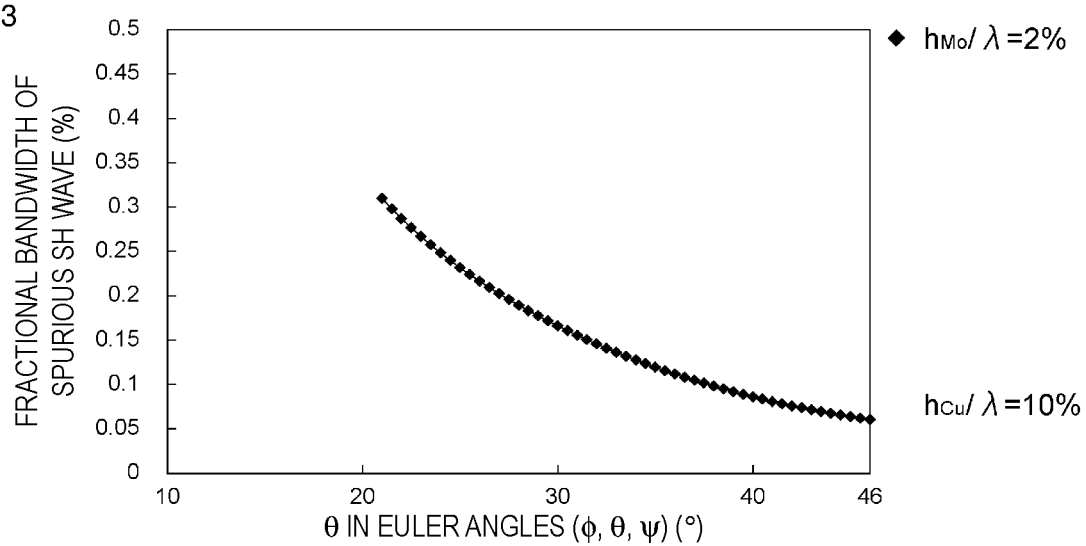
FIG. 23 is a graph indicating a relationship among the film thickness $h_{Mo}/\lambda$ of the first electrode layer, θ in the Euler Angles (φ, θ, ψ), and the fractional bandwidth of the spurious SH wave when the film thickness $h_{Cu}/\lambda$ of the second electrode layer is about 10% in the third preferred embodiment of the present invention.

FIG. 23 is a graph indicating a relationship among the film thickness $h_{Mo}/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the third preferred embodiment. FIG. 23 illustrates the case in which the film thickness $h_{Mo}/\lambda$ of the first electrode layer is about 2%.

As illustrated in FIG. 23, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 17. Therefore, the spurious SH wave is effectively reduced or prevented.

Figure 24:
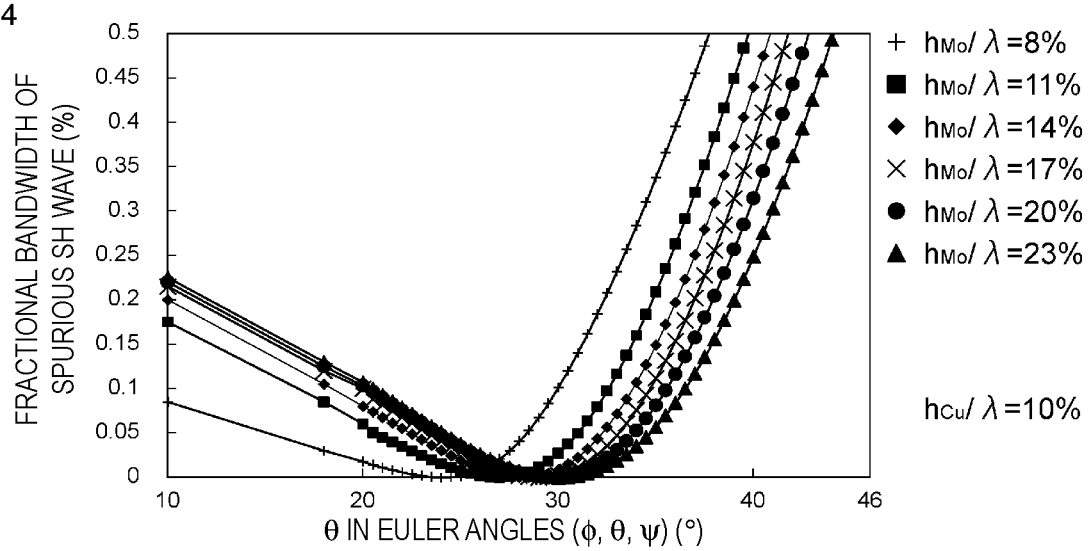
FIG. 24 is a graph indicating a relationship among the film thickness $h_{Mo}/\lambda$ of the first electrode layer, θ in the Euler Angles (φ, θ, ψ), and the fractional bandwidth of the spurious SH wave when the film thickness $h_{Cu}/\lambda$ of the second electrode layer is about 10% in the third preferred embodiment of the present invention.

FIG. 24 is a graph indicating a relationship among the film thickness $h_{Mo}/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the third preferred embodiment. FIG. 24 illustrates the cases in which the film thickness $h_{Mo}/\lambda$ of the first electrode layer is about 8%, about 11%, about 14%, about 17%, about 20%, and about 23%.

As illustrated in FIG. 24, the fractional bandwidth of the spurious SH wave is reduced to be equal to or lower than about 0.15% with the combination of the film thickness $h_{Mo}/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 18. Therefore, the spurious SH wave is effectively reduced or prevented.

The effect that is the same as that described above is able to be provided even when the Euler Angles ($\phi$, $\theta$, $\psi$) of the piezoelectric substrate are Euler Angles (0°±5°, $\theta$, 0°±5°). In the specification, 0°±5° indicates within a range of about 0°±5°.

A fourth preferred embodiment of the present invention will be described below.

An elastic wave device according to the fourth preferred embodiment is different from that according to the first preferred embodiment in that the first electrode layer is preferably made of W and the film thickness of the first electrode layer is different from that of the first preferred embodiment. The elastic wave device according to the fourth preferred embodiment preferably has the same or substantially the same configurations as those of the elastic wave device 1 in the first preferred embodiment illustrated in FIG. 1 other than the above-described points.

The film thickness of the first electrode layer, which is normalized by the wave length $\lambda$, is $h_W/\lambda$(%). In this case, in the present preferred embodiment, the film thickness $h_W/\lambda$ of the first electrode layer is preferably about 2%, for example. It should be noted that the film thickness $h_W/\lambda$ is not limited to the above-described one.

Also in the present preferred embodiment, the trade-off relationship between the frequency temperature characteristic (TCV) and the fractional bandwidth is improved. The above-described effect will be described below by comparing the present preferred embodiment and third and fourth comparative examples.

Also in the present preferred embodiment, the electrical resistance of the IDT electrode is able to be reduced because the second electrode layer made of Cu with a low resistance is used. Furthermore, the fractional bandwidth is able to be efficiently improved by arranging the second electrode layer made of Cu on the first electrode layer made of W.

The third comparative example is different from the fourth preferred embodiment in that the second electrode layer in the IDT electrode is made of Al. The fourth comparative example is different from the fourth preferred embodiment in that the second electrode layer is made of Mg.

In the third comparative example, the film thickness of the second electrode layer, which is normalized by the wave length $\lambda$, is $h_{Al}/\lambda(\%)$, as in the first comparative example. In the fourth comparative example, the film thickness of the second electrode layer, which is normalized by the wave length $\lambda$, is $h_{Mg}/\lambda(\%)$, as in the second comparative example.

A plurality of elastic wave devices in the fourth preferred embodiment and the third and fourth comparative examples were produced while varying the film thicknesses of the second electrode layers and the film thicknesses of the dielectric films. The frequency temperature characteristics (TCV) and the fractional bandwidths of the plurality of elastic wave devices described above were measured.

Figure 25:
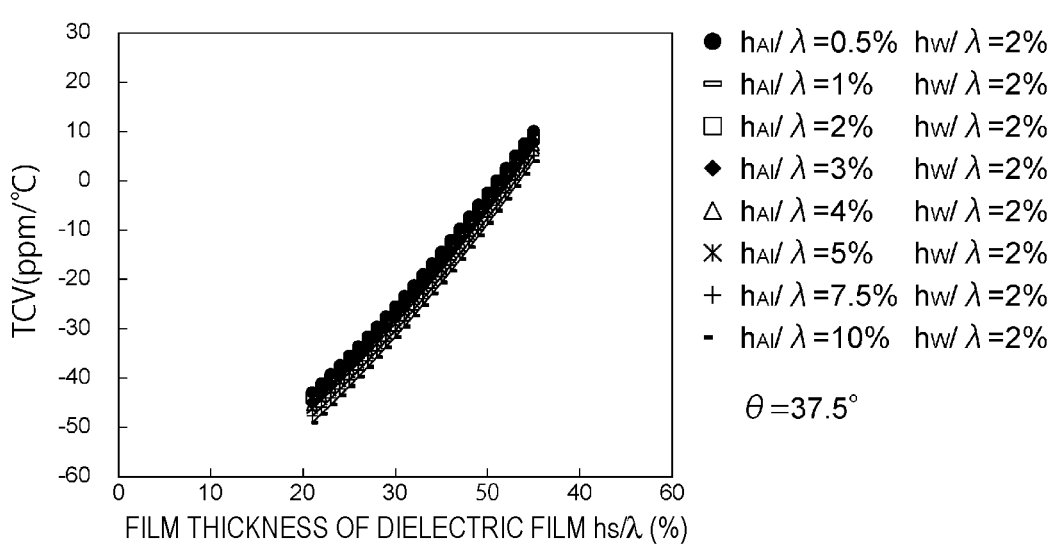
FIG. 25 is a graph indicating a relationship among the film thickness $h_s/\lambda$ of the dielectric film, the film thickness $h_{Al}/\lambda$ of the second electrode layer, and the frequency temperature characteristic (TCV) in a third comparative example.
Figure 26:
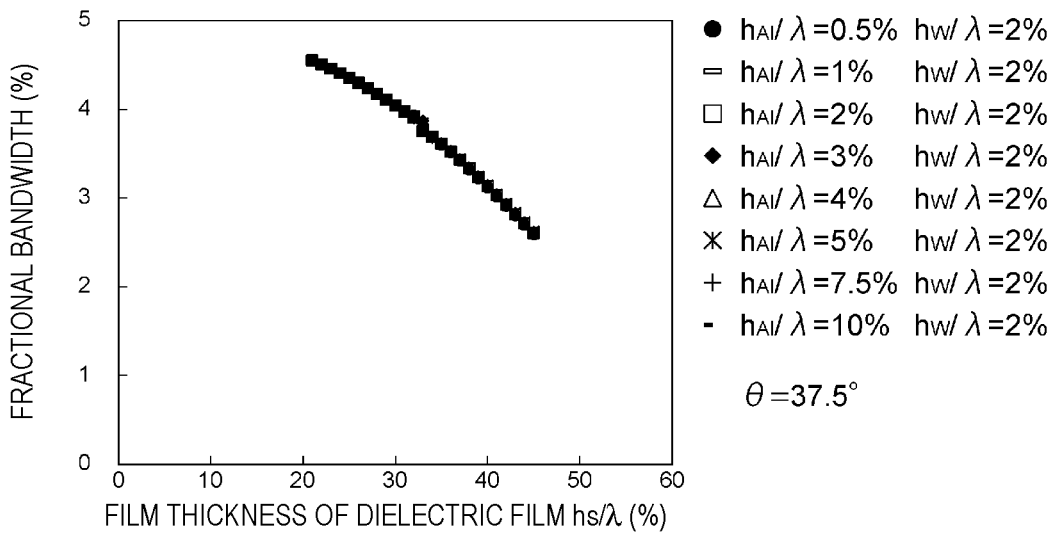
FIG. 26 is a graph indicating a relationship among the film thickness $h_s/\lambda$ of the dielectric film, the film thickness $h_{Al}/\lambda$ of the second electrode layer, and the fractional bandwidth in the third comparative example.
Figure 27:
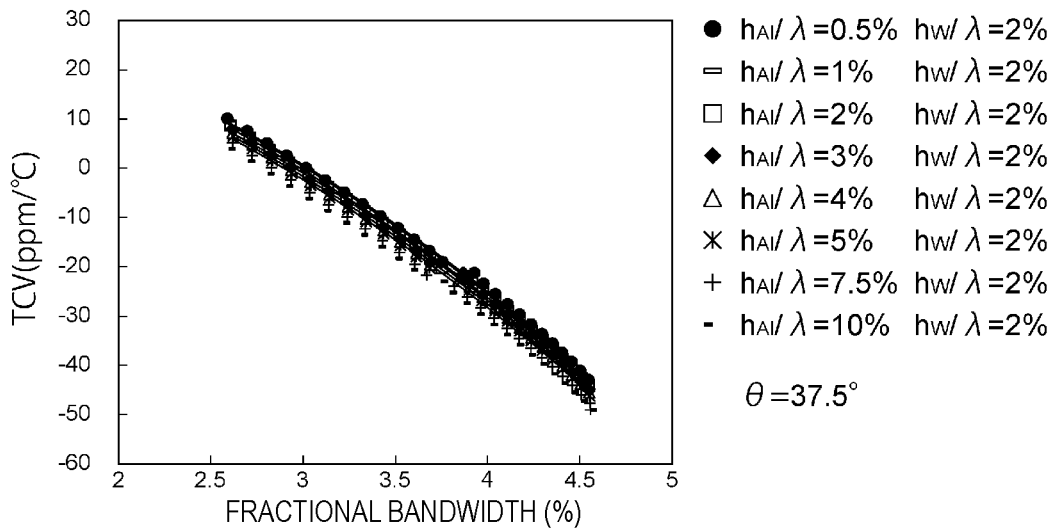
FIG. 27 is a graph indicating a relationship between the trade-off relationship between the frequency temperature characteristic (TCV) and the fractional bandwidth and the film thickness $h_{Al}/\lambda$ of the second electrode layer in the third comparative example.

FIG. 25 is a graph indicating a relationship among the film thickness $h_s/\lambda$ of the dielectric film, the film thickness $h_{Al}/\lambda$ of the second electrode layer, and the frequency temperature characteristic (TCV) in the third comparative example. FIG. 26 is a graph indicating a relationship among the film thickness $h_s/\lambda$ of the dielectric film, the film thickness $h_{Al}/\lambda$ of the second electrode layer, and the fractional bandwidth in the third comparative example. FIG. 27 is a graph indicating a relationship between the trade-off relationship between the frequency temperature characteristic (TCV) and the fractional bandwidth and the film thickness $h_{Al}/\lambda$ of the second electrode layer in the third comparative example. In the third comparative example, the film thickness $h_{Al}/\lambda$ of the second electrode layer is set to about 0.5%, about 1%, about 2%, about 3%, about 4%, about 5%, about 7.5%, and about 10%.

As illustrated in FIG. 25, it was determined that as the film thickness $h_{Al}/\lambda$ of the second electrode layer is increased, an absolute value of the frequency temperature characteristic (TCV) is increased and the frequency temperature characteristic is deteriorated when the film thickness $h_s/\lambda$ of the dielectric film is the same in the third comparative example. As illustrated in FIG. 26, however, it was determined that even when the film thickness $h_{Al}/\lambda$ of the second electrode layer is varied, the fractional bandwidth does not vary substantially. Therefore, as illustrated in FIG. 27, as the film thickness $h_{Al}/\lambda$ of the second electrode layer is increased, the frequency temperature characteristic (TCV) is deteriorated when the fractional bandwidth is the same. As described above, in the third comparative example in which the second electrode layer is made of Al, as the film thickness $h_{Al}/\lambda$ of the second electrode layer is increased, the trade-off relationship is deteriorated.

Figure 28:
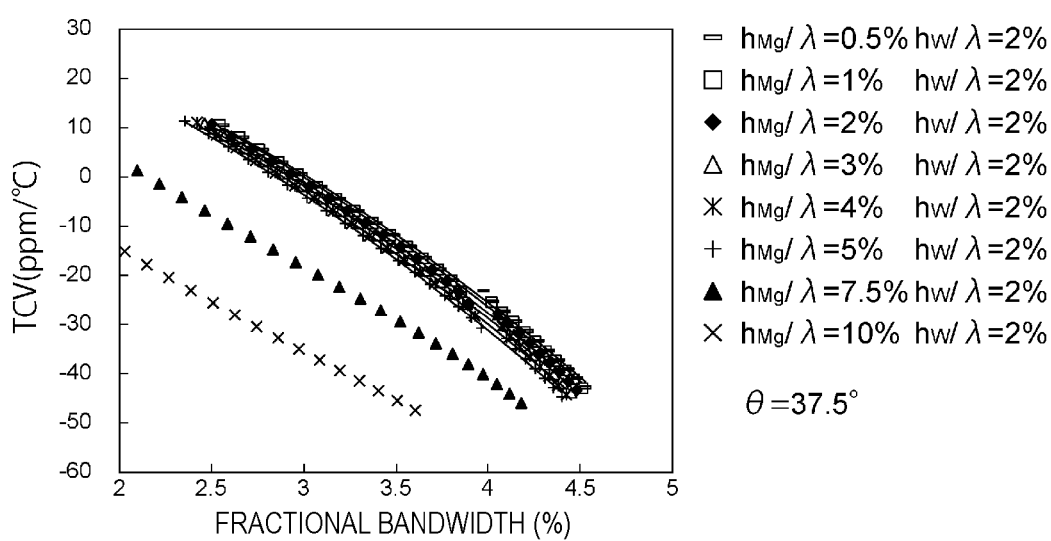
FIG. 28 is a graph indicating a relationship between the trade-off relationship between the frequency temperature characteristic (TCV) and the fractional bandwidth and the film thickness $h_{Mg}/\lambda$ of the second electrode layer in a fourth comparative example.

FIG. 28 is a graph indicating a relationship between the trade-off relationship between the frequency temperature characteristic (TCV) and the fractional bandwidth and the film thickness $h_{Mg}/\lambda$ of the second electrode layer in the fourth comparative example. In the fourth comparative example, the film thickness $h_{Mg}/\lambda$ of the second electrode layer is each set to about 0.5%, about 1%, about 2%, about 3%, about 4%, about 5%, about 7.5%, and about 10%.

As illustrated in FIG. 28, it was determined that also in the fourth comparative example in which the second electrode layer is made of Mg, as the film thickness $h_{Mg}/\lambda$ of the second electrode layer is increased, the trade-off relationship between the frequency temperature characteristic (TCV) and the fractional bandwidth is deteriorated in the same or similar manner as in the third comparative example.

By contrast, in the fourth preferred embodiment, the trade-off relationship between the frequency temperature characteristic (TCV) and the fractional bandwidth is improved because the second electrode layer is made of Cu as in the first preferred embodiment. This effect is described with reference to FIG. 29 to FIG. 32 below.

Figure 29:
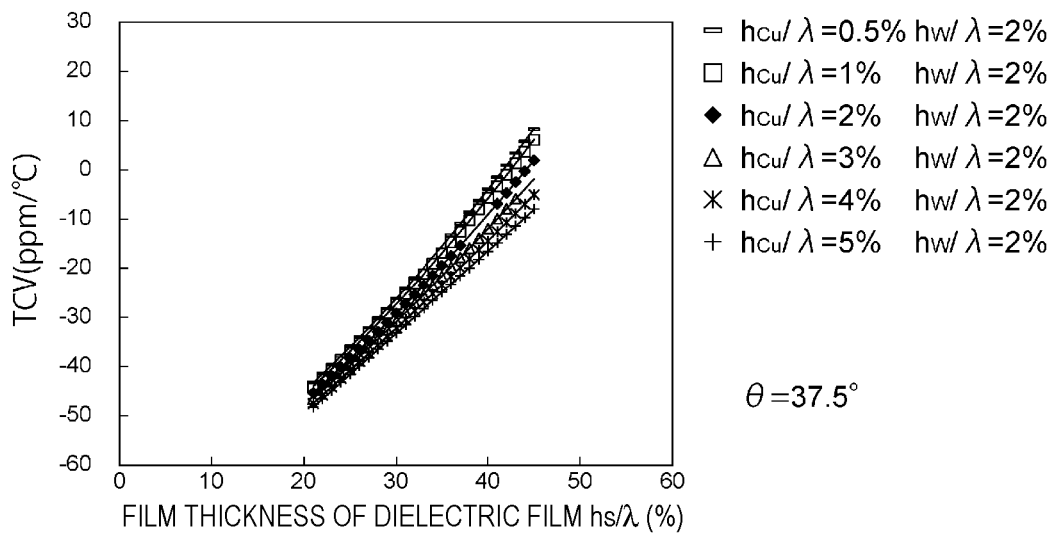
FIG. 29 is a graph indicating a relationship among the film thickness $h_s/\lambda$ of the dielectric film, the film thickness $h_{Cu}/\lambda$ of the second electrode layer, and the frequency temperature characteristic (TCV) in a fourth preferred embodiment of the present invention.
Figure 30:
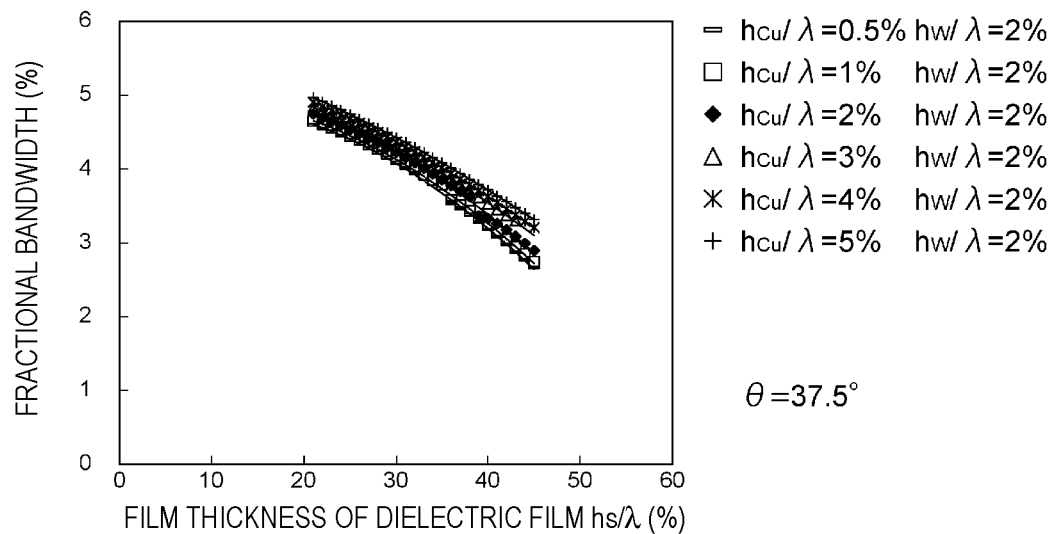
FIG. 30 is a graph indicating a relationship among the film thickness $h_s/\lambda$ of the dielectric film, the film thickness $h_{Cu}/\lambda$ of the second electrode layer, and the fractional bandwidth in the fourth preferred embodiment of the present invention.
Figure 31:
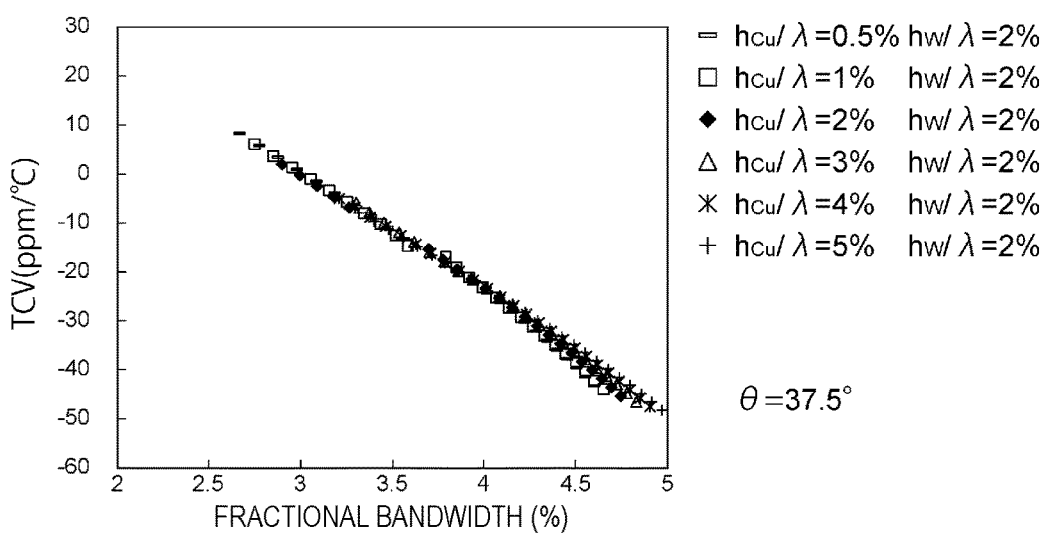
FIG. 31 is a graph indicating a relationship between the trade-off relationship between the frequency temperature characteristic (TCV) and the fractional bandwidth and the film thickness $h_{Cu}/\lambda$ of the second electrode layer in the fourth preferred embodiment of the present invention.

FIG. 29 is a graph indicating a relationship among the film thickness $h_s/\lambda$ of the dielectric film, the film thickness $h_{Cu}/\lambda$ of the second electrode layer, and the frequency temperature characteristic (TCV) in the fourth preferred embodiment. FIG. 30 is a graph indicating a relationship among the film thickness $h_s/\lambda$ of the dielectric film, the film thickness $h_{Cu}/\lambda$ of the second electrode layer, and the fractional bandwidth in the fourth preferred embodiment. FIG. 31 is a graph indicating a relationship between the trade-off relationship between the frequency temperature characteristic (TCV) and the fractional bandwidth and the film thickness $h_{Cu}/\lambda$ of the second electrode layer in the fourth preferred embodiment. In the fourth preferred embodiment, the film thickness $h_{Cu}/\lambda$ of the second electrode layer is each set to about 0.5%, about 1%, about 2%, about 3%, about 4%, and about 5%.

As illustrated in FIG. 29, in the fourth preferred embodiment, as the film thickness $h_{Cu}/\lambda$ of the second electrode layer is increased, the frequency temperature characteristic (TCV) is deteriorated when the film thickness $h_s/\lambda$ of the dielectric film is the same. On the other hand, as illustrated in FIG. 30, it was determined that as the film thickness $h_{Cu}/\lambda$ of the second electrode layer is increased, the fractional bandwidth is increased when the film thickness $h_s/\lambda$ of the dielectric film is the same. As illustrated in FIG. 31, it was determined that as the film thickness $h_{Cu}/\lambda$ of the second electrode layer is increased, the frequency temperature characteristic (TCV) is improved when the fractional bandwidth is the same. As described above, the trade-off relationship between the frequency temperature characteristic (TCV) and the fractional bandwidth is improved in the fourth preferred embodiment.

Figure 32:
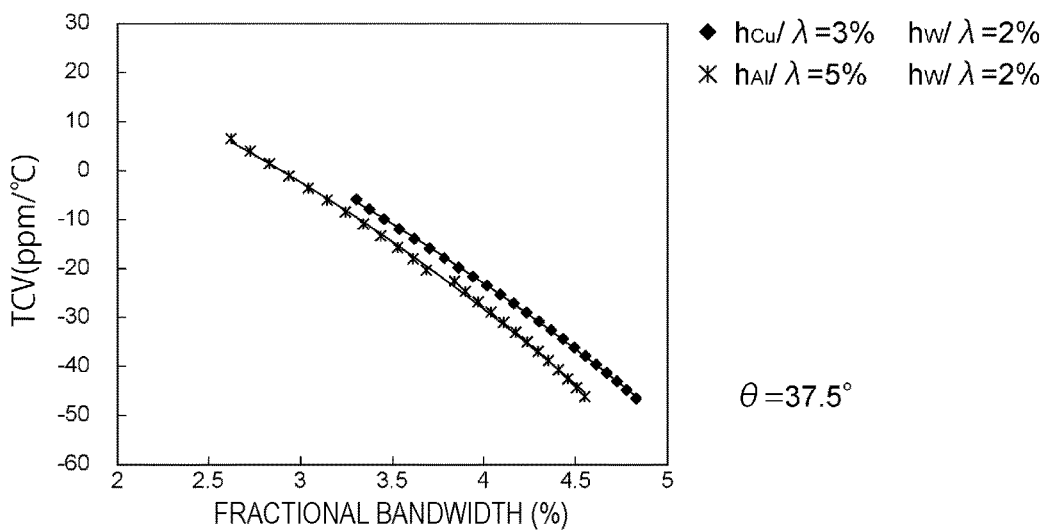
FIG. 32 is a graph indicating the trade-off relations between the frequency temperature characteristic (TCV) and the fractional bandwidth in the fourth preferred embodiment of the present invention and the third comparative example.

FIG. 32 is a graph indicating the trade-off relationships between the frequency temperature characteristic (TCV) and the fractional bandwidth in the fourth preferred embodiment and the third comparative example. FIG. 32 indicates a result when the film thickness $h_{Cu}/\lambda$ of the second electrode layer is about 3% in the fourth preferred embodiment and a result when the film thickness $h_{Al}/\lambda$ of the second electrode layer is about 5% in the third comparative example.

As illustrated in FIG. 32, it was determined that the fractional bandwidth in the fourth preferred embodiment is higher than the fractional bandwidth in the third comparative example when the frequency temperature characteristic (TCV) is the same. As described above, the trade-off relationship between the frequency temperature characteristic (TCV) and the fractional bandwidth is improved in the fourth preferred embodiment.

Furthermore, the second electrode layer is made of Cu and has the electrical resistance which is sufficiently lower than that of the first electrode layer made of W. Therefore, the above-described trade-off relationship is improved and the electrical resistance of the IDT electrode is effectively lowered by increasing the film thickness $h_{Cu}/\lambda$ of the second electrode layer.

A fifth preferred embodiment of the present invention will be described below.

An elastic wave device according to the fifth preferred embodiment is different from that according to the fourth preferred embodiment in a relationship between the film thickness $h_W/\lambda$ of the first electrode layer and the film thickness $h_{Cu}/\lambda$ of the second electrode layer. The elastic wave device according to the fifth preferred embodiment preferably has the same or substantially the same configurations as those of the elastic wave device in the fourth preferred embodiment other than the above-described point.

To be more specific, in the present preferred embodiment, the film thickness $h_W/\lambda$ of the first electrode layer and the film thickness $h_{Cu}/\lambda$ of the second electrode layer have a relationship of the following equation 2:

$$h_W/\lambda \geq -0.3343 \times h_{Cu}/\lambda + 0.7879 \quad \text{(Equation 2).}$$

Energy of elastic waves is effectively confined in the surface of the IDT electrode by satisfying the above-described equation 2. This confinement effectively increases the fractional bandwidth to further improve the trade-off relationship between the frequency temperature characteristic (TCV) and the fractional bandwidth. This effect will be described below.

Figure 33:
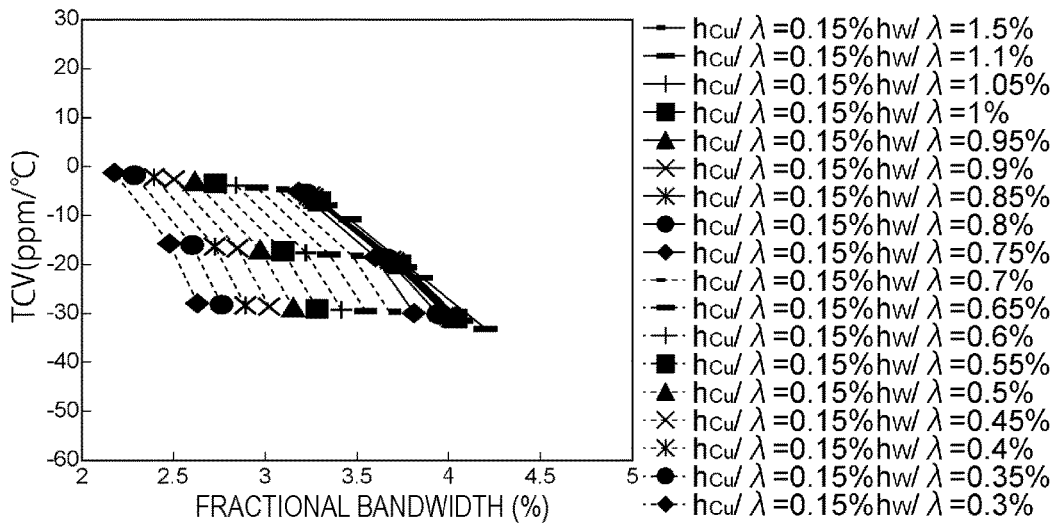
FIG. 33 is a graph indicating a relationship between the trade-off relationship between the frequency temperature characteristic (TCV) and the fractional bandwidth and a film thickness $h_W/\lambda$ of the first electrode layer when the film thickness $h_{Cu}/\lambda$ of the second electrode layer is about 0.15%.
Figure 34:
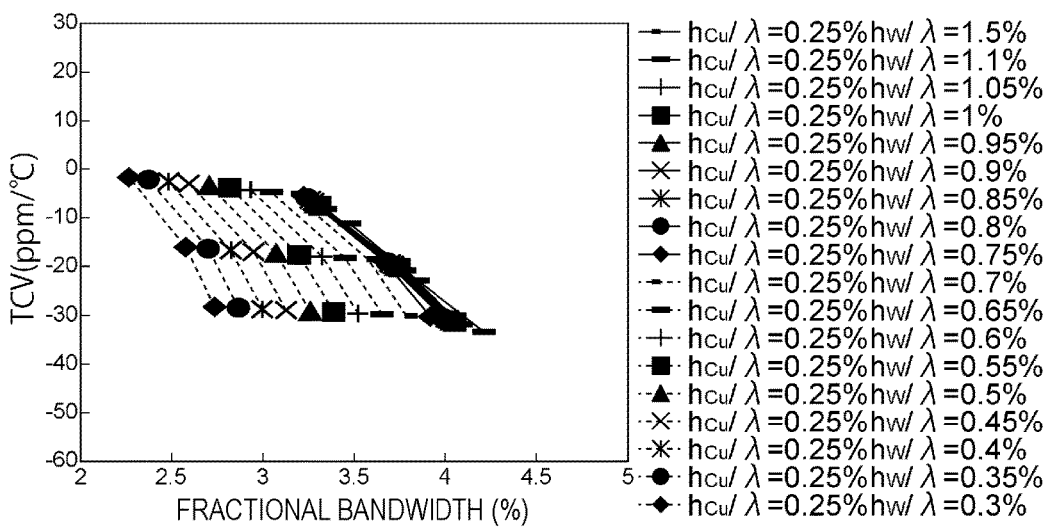
FIG. 34 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.25%.
Figure 35:
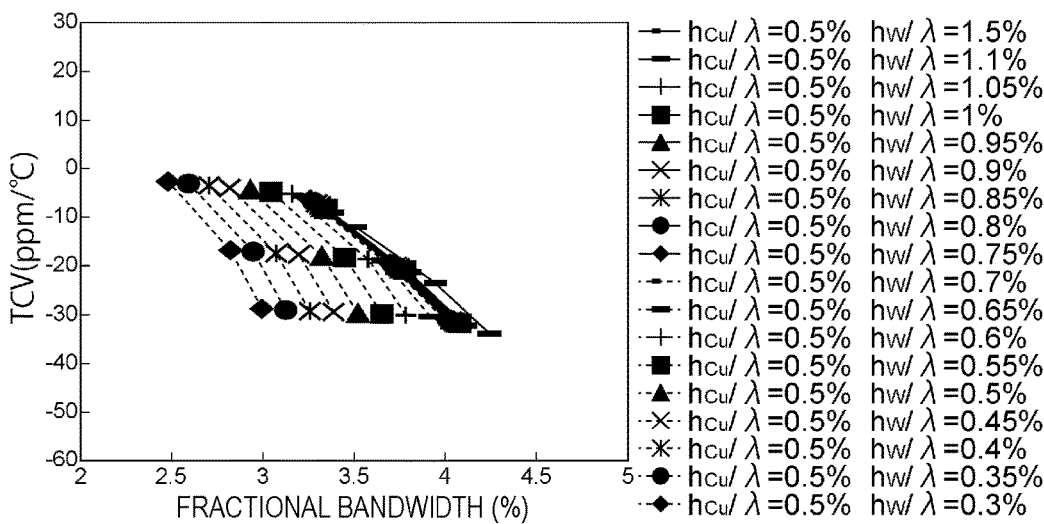
FIG. 35 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.5%.
Figure 36:
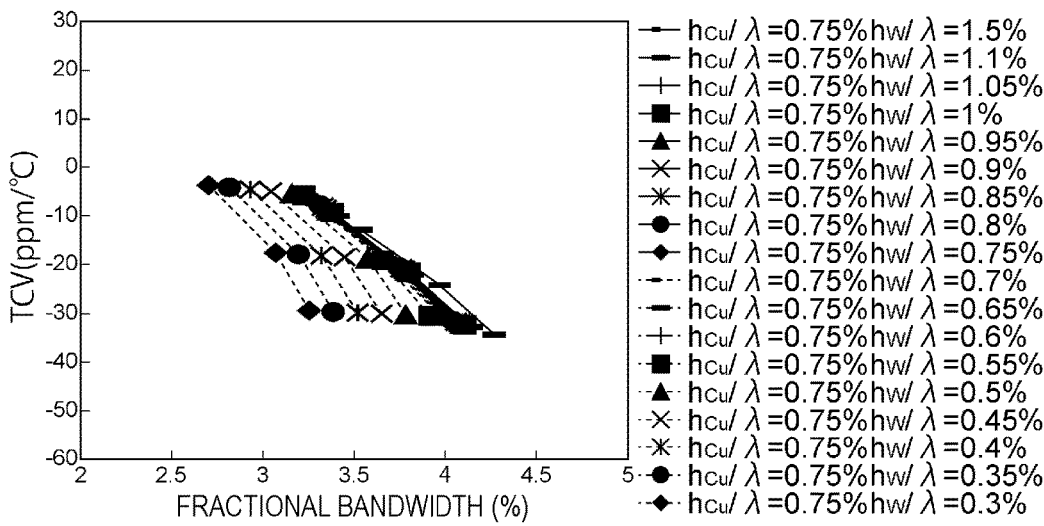
FIG. 36 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.75%.
Figure 37:
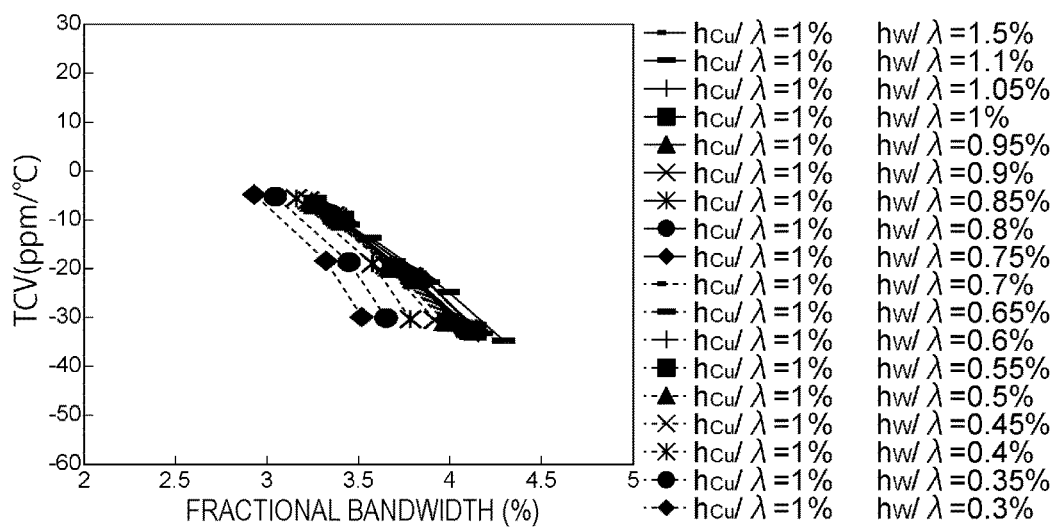
FIG. 37 is a graph indicating a relationship between the trade-off relationship between the frequency temperature characteristics (TCV) and the fractional bandwidth and the film thickness $h_W/\lambda$ of the first electrode layer when the film thickness $h_{Cu}/\lambda$ of the second electrode layer is about 1%.

FIG. 33 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.15%. FIG. 34 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.25%. FIG. 35 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.5%. FIG. 36 is a graph indicating a relationship between the trade-off relationship between the frequency temperature characteristic (TCV) and the fractional bandwidth and the film thickness $h_W/\lambda$ of the first electrode layer when the film thickness $h_{Cu}/\lambda$ of the second electrode layer is about 0.75%. FIG. 37 is a graph indicating a relationship between the trade-off relationship between the frequency temperature characteristics (TCV) and the fractional bandwidth and the film thickness $h_W/\lambda$ of the first electrode layer when the film thickness $h_{Cu}/\lambda$ of the second electrode layer is about 1%.

As illustrated in FIG. 33, as the film thickness $h_W/\lambda$ of the first electrode layer is increased, the fractional bandwidth is increased when the frequency temperature characteristic (TCV) is the same. Therefore, it was determined that the trade-off relationship between the frequency temperature characteristic (TCV) and the fractional bandwidth is improved. In particular, it was determined that under the condition in which the film thickness $h_W/\lambda$ of the first electrode layer is higher than about 0.75%, variation in the fractional bandwidth relative to the film thickness $h_W/\lambda$ is significantly decreased. In the same or similar manner, as illustrated in FIG. 34 to FIG. 37, in the cases in which the film thickness $h_{Cu}/\lambda$ of the second electrode layer is about 0.25% to about 1%, as the film thickness $h_W/\lambda$ of the first electrode layer is increased, the above-described trade-off relationship is further improved. Furthermore, it was determined that under the condition in which the film thickness $h_W/\lambda$ is higher than a certain value, variation in the fractional bandwidth is significantly decreased by increasing the film thickness $h_W/\lambda$ to be higher than the certain value.

In order to provide the film thickness $h_W/\lambda$ of the first electrode layer with which the increased fractional bandwidth is able to be stably provided, relationships between the film thickness $h_W/\lambda$ of the first electrode layer and the fractional bandwidth when the frequency temperature characteristic (TCV) was about −20 ppm/° C. in the cases in which the film thickness $h_{Cu}/\lambda$ of the second electrode layer was about 0.15%, about 0.25%, about 0.5%, about 0.75%, and about 1% were respectively calculated from FIG. 33 to FIG. 37.

Figure 38:
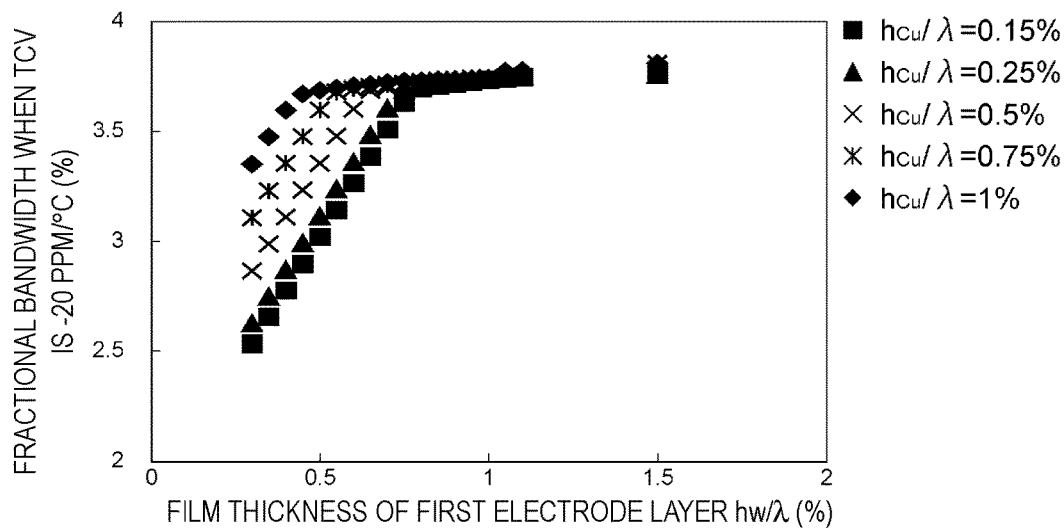
FIG. 38 is a graph indicating a relationship among the film thickness $h_W/\lambda$ of the first electrode layer, the film thickness $h_{Cu}/\lambda$ of the second electrode layer, and the fractional bandwidth when the frequency temperature characteristic (TCV) is about −20 ppm/° C.

FIG. 38 is a graph indicating a relationship among the film thickness $h_W/\lambda$ of the first electrode layer, the film thickness $h_{Cu}/\lambda$ of the second electrode layer, and the fractional bandwidth when the frequency temperature characteristic (TCV) is about −20 ppm/° C.

As illustrated in FIG. 38, in the case in which the film thickness $h_{Cu}/\lambda$ of the second electrode layer is about 0.15%, when the film thickness $h_W/\lambda$ of the first electrode layer is equal to or higher than about 0.75%, the fractional bandwidth is effectively and stably increased. Therefore, the above-described trade-off relationship is further improved. In the same or similar manner, in the case in which the film thickness $h_{Cu}/\lambda$ of the second electrode layer is about 0.25%, when the film thickness $h_W/\lambda$ of the first electrode layer is equal to or higher than about 0.7%, the fractional bandwidth is effectively and stably increased and the above-described trade-off relationship is further improved. In the case in which the film thickness $h_{Cu}/\lambda$ of the second electrode layer is about 0.5%, when the film thickness $h_W/\lambda$ of the first electrode layer is equal to or higher than about 0.6%, the fractional bandwidth is effectively and stably increased and the above-described trade-off is further improved. In the case in which the film thickness $h_{Cu}/\lambda$ of the second electrode layer is about 0.75%, when the film thickness $h_W/\lambda$ of the first electrode layer is equal to or higher than about 0.55%, the fractional bandwidth is effectively and stably increased and the above-described trade-off is further improved. In the case in which the film thickness $h_{Cu}/\lambda$ of the second electrode layer is about 1%, when the film thickness $h_W/\lambda$ of the first electrode layer is equal to or higher than about 0.45%, the fractional bandwidth is effectively and stably increased and the above-described trade-off is further improved.

The relationship between the film thickness $h_{Cu}/\lambda$ of the second electrode layer and the film thickness $h_W/\lambda$ of the first electrode layer with which the fractional bandwidth is able to be stably increased was obtained from FIG. 38.

Figure 39:
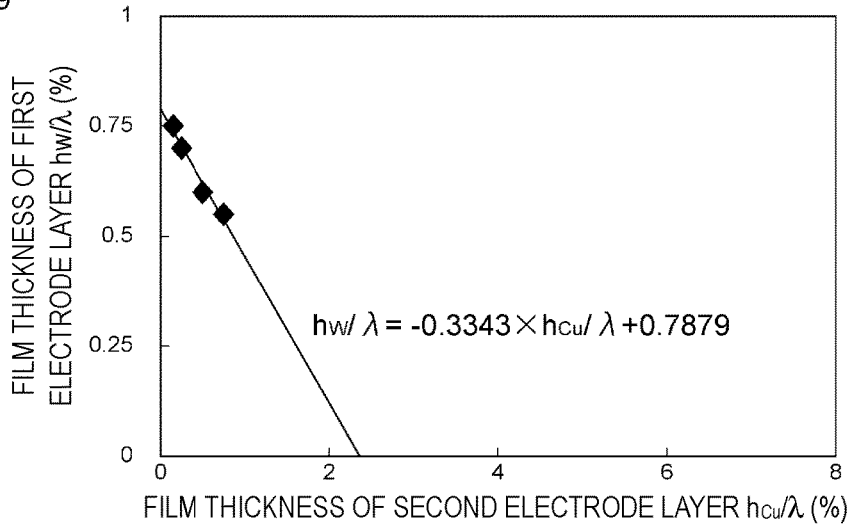
FIG. 39 is a graph indicating a relationship between the film thickness $h_{Cu}/\lambda$ of the second electrode layer and the film thickness $h_W/\lambda$ of the first electrode layer with which the fractional bandwidth is able to be stably increased.

FIG. 39 is a graph indicating a relationship between the film thickness $h_{Cu}/\lambda$ of the second electrode layer and the film thickness $h_W/\lambda$ of the first electrode layer with which the fractional bandwidth is able to be stably increased.

As illustrated in FIG. 39, when the film thickness $h_W/\lambda$ of the first electrode layer and the film thickness $h_{Cu}/\lambda$ of the second electrode layer have the relationship of the above-described equation 2, the fractional bandwidth is stably increased. Accordingly, the trade-off relationship between the frequency temperature characteristic (TCV) and the fractional bandwidth is further improved in the preferred embodiment.

It is preferable that the film thickness $h_W/\lambda$ of the first electrode layer be equal to or lower than about 30%, for example. In this case, an increase in a stress of the first electrode layer is reduced or prevented and the piezoelectric substrate will not be damaged easily. The first electrode layer is able to be formed to have a desired shape more reliably by setting the film thickness $h_W/\lambda$ of the first electrode layer to be equal to or lower than about 30% as in the first preferred embodiment. With this, the IDT electrode is able to be formed to have a desired shape more reliably.

It is preferable that the film thickness $h_{Cu}/\lambda$ of the second electrode layer be equal to or lower than about 15%, for example. Also in this case, the IDT electrode is able to be easily formed in a manufacturing process of the elastic wave device, so as to improve the productivity.

A sixth preferred embodiment of the present invention will be described below.

An elastic wave device according to the sixth preferred embodiment is different from that according to the fourth preferred embodiment in a relationship among the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate. The elastic wave device according to the sixth preferred embodiment preferably has the same or substantially the same configurations as those of the elastic wave device in the fourth preferred embodiment other than the above-described point.

To be more specific, in the present preferred embodiment, the Euler Angles ($\phi$, $\theta$, $\psi$) of the piezoelectric substrate are preferably Euler Angles (0°, $\theta$, 0°), for example. A combination of the film thickness $h_W/\lambda$ of the first electrode layer, the film thickness $h_{Cu}/\lambda$ of the second electrode layer, and $\theta$ in the Euler Angles ($\phi$, $\theta$, $\psi$) of the piezoelectric substrate is any one of combinations indicated in Table 7 to Table 12.

TABLE 7

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $h_{Cu}/\lambda \leq 5.5$ | $0 < -0.3343 \times h_{Cu}/\lambda + 0.7879 \leq h_W/\lambda < 1.25$ | $34.7 \leq \theta \leq 40.7$ |
| $h_{Cu}/\lambda \leq 5.5$ | $1.25 \leq h_W/\lambda < 1.75$ | $33.8 \leq \theta \leq 43$ |
| $h_{Cu}/\lambda \leq 5.5$ | $1.75 \leq h_W/\lambda < 2.25$ | $33.2 \leq \theta \leq 46$ |
| $h_{Cu}/\lambda \leq 5.5$ | $2.25 \leq h_W/\lambda < 2.75$ | $32.6 \leq \theta \leq 46$ |
| $h_{Cu}/\lambda \leq 5.5$ | $2.75 \leq h_W/\lambda < 3.25$ | $32 \leq \theta \leq 46$ |
| $h_{Cu}/\lambda \leq 5.5$ | $3.25 \leq h_W/\lambda \leq 3.75$ | $31.7 \leq \theta \leq 46$ |

TABLE 8

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $h_{Cu}/\lambda \leq 5.5$ | $4 \leq h_W/\lambda < 6$ | $10 \leq \theta \leq 29.5$ |
| $h_{Cu}/\lambda \leq 5.5$ | $6 \leq h_W/\lambda < 7$ | $15.7 \leq \theta \leq 32.2$ |
| $h_{Cu}/\lambda \leq 5.5$ | $7 \leq h_W/\lambda \leq 8$ | $18.5 \leq \theta \leq 34.5$ |

TABLE 9

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $5.5 < h_{Cu}/\lambda \leq 8.5$ | $0 < -0.3343 \times h_{Cu}/\lambda + 0.7879 \leq h_W/\lambda < 0.75$ | $33.3 \leq \theta \leq 46$ |
| $5.5 < h_{Cu}/\lambda \leq 8.5$ | $0.75 \leq h_W/\lambda < 1.25$ | $32.8 \leq \theta \leq 46$ |
| $5.5 < h_{Cu}/\lambda \leq 8.5$ | $1.25 \leq h_W/\lambda < 1.75$ | $32.2 \leq \theta \leq 46$ |
| $5.5 < h_{Cu}/\lambda \leq 8.5$ | $1.75 \leq h_W/\lambda < 2.25$ | $31.6 \leq \theta \leq 46$ |
| $5.5 < h_{Cu}/\lambda \leq 8.5$ | $2.25 \leq h_W/\lambda < 2.75$ | $31 \leq \theta \leq 46$ |

TABLE 10

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $5.5 < h_{Cu}/\lambda \leq 8.5$ | $4.5 \leq h_W/\lambda < 5.25$ | $12.7 \leq \theta \leq 31.3$ |
| $5.5 < h_{Cu}/\lambda \leq 8.5$ | $5.25 \leq h_W/\lambda < 6$ | $16.2 \leq \theta \leq 32.6$ |
| $5.5 < h_{Cu}/\lambda \leq 8.5$ | $6 \leq h_W/\lambda < 7$ | $19 \leq \theta \leq 34.3$ |
| $5.5 < h_{Cu}/\lambda \leq 8.5$ | $7 \leq h_W/\lambda \leq 8$ | $19.8 \leq \theta \leq 35.2$ |

TABLE 11

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $8.5 < h_{Cu}/\lambda \leq 11.5$ | $0 < -0.3343 \times h_{Cu}/\lambda + 0.7879 \leq h_W/\lambda < 0.75$ | $31.8 \leq \theta \leq 46$ |
| $8.5 < h_{Cu}/\lambda \leq 11.5$ | $0.75 \leq h_W/\lambda < 1.25$ | $31 \leq \theta \leq 46$ |
| $8.5 < h_{Cu}/\lambda \leq 11.5$ | $1.25 \leq h_W/\lambda < 1.75$ | $30 \leq \theta \leq 46$ |
| $8.5 < h_{Cu}/\lambda \leq 11.5$ | $1.75 \leq h_W/\lambda < 2.25$ | $27 \leq \theta \leq 46$ |

TABLE 12

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
| --- | --- | --- |
| $8.5 < h_{Cu}/\lambda \leq 11.5$ | $4 \leq h_W/\lambda < 5$ | $14.3 \leq \theta \leq 31.7$ |
| $8.5 < h_{Cu}/\lambda \leq 11.5$ | $5 \leq h_W/\lambda < 6$ | $18 \leq \theta \leq 33.8$ |
| $8.5 < h_{Cu}/\lambda \leq 11.5$ | $6 \leq h_W/\lambda < 7$ | $19.2 \leq \theta \leq 34.8$ |
| $8.5 < h_{Cu}/\lambda \leq 11.5$ | $7 \leq h_W/\lambda \leq 8$ | $20.2 \leq \theta \leq 35.3$ |

The film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate have the above-described relationship, which reduces or prevents a spurious SH wave. This effect will be described below.

Figure 40:
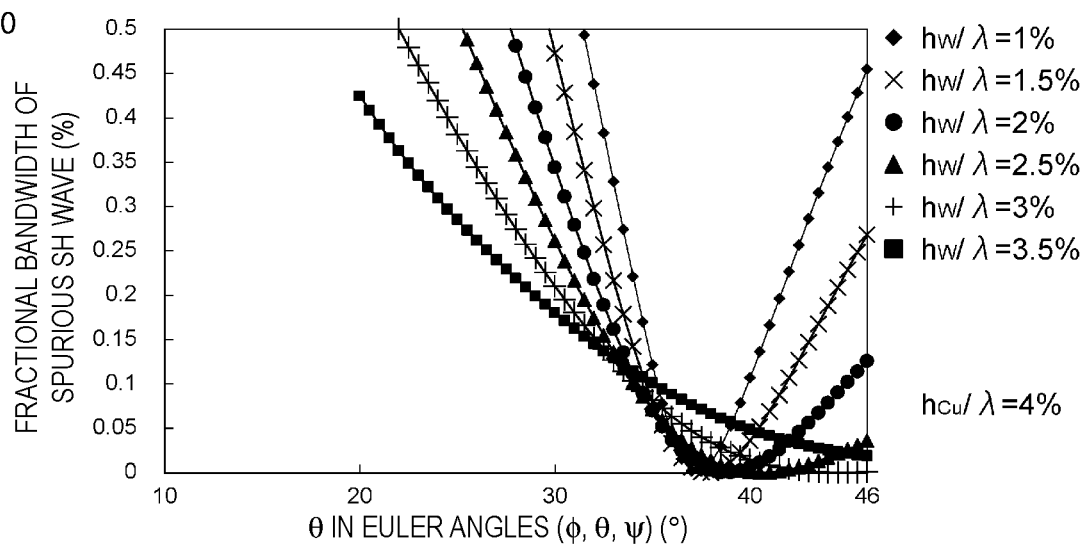
FIG. 40 is a graph indicating a relationship among the film thickness $h_W/\lambda$ of the first electrode layer, θ in the Euler Angles (φ, θ, ψ), and the fractional bandwidth of the spurious SH wave when the film thickness $h_{Cu}/\lambda$ of the second electrode layer is about 4% in a sixth preferred embodiment of the present invention.

FIG. 40 is a graph indicating a relationship among the film thickness $h_W/\lambda$ of the first electrode layer, $\theta$ in the Euler Angles ($\phi$, $\theta$, $\psi$), and a fractional bandwidth of the spurious SH wave when the film thickness $h_{Cu}/\lambda$ of the second electrode layer is about 4% in the sixth preferred embodiment. $\theta$ in the Euler Angles ($\phi$, $\theta$, $\psi$) was calculated in a range of about 10° to about 46° in which the Rayleigh waves are primarily excited. FIG. 40 illustrates the cases in which the film thickness $h_W/\lambda$ of the first electrode layer is about 1%, about 1.5%, about 2%, about 2.5%, about 3%, and about 3.5%.

As illustrated in FIG. 40, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 19. Therefore, the spurious SH wave is effectively reduced or prevented.

Figure 41:
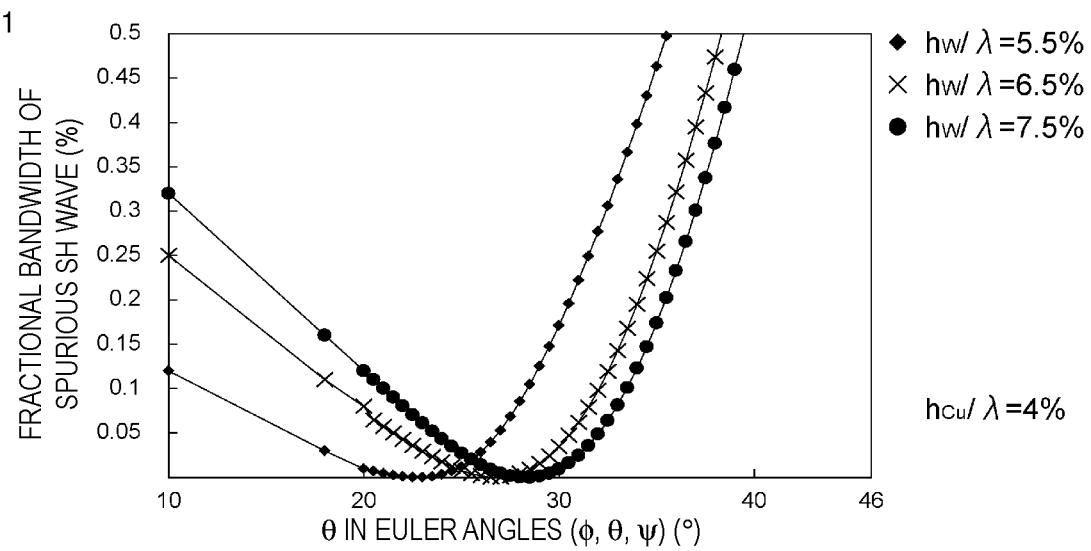
FIG. 41 is a graph indicating a relationship among the film thickness $h_W/\lambda$ of the first electrode layer, θ in the Euler Angles (φ, θ, ψ), and the fractional bandwidth of the spurious SH wave when the film thickness $h_{Cu}/\lambda$ of the second electrode layer is about 4% in the sixth preferred embodiment of the present invention.

FIG. 41 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 4% in the sixth preferred embodiment. FIG. 41 illustrates the cases in which the film thickness $h_W/\lambda$ of the first electrode layer is about 5.5%, about 6.5%, and about 7.5%.

As illustrated in FIG. 41, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 20. Therefore, the spurious SH wave is effectively reduced or prevented.

Figure 42:
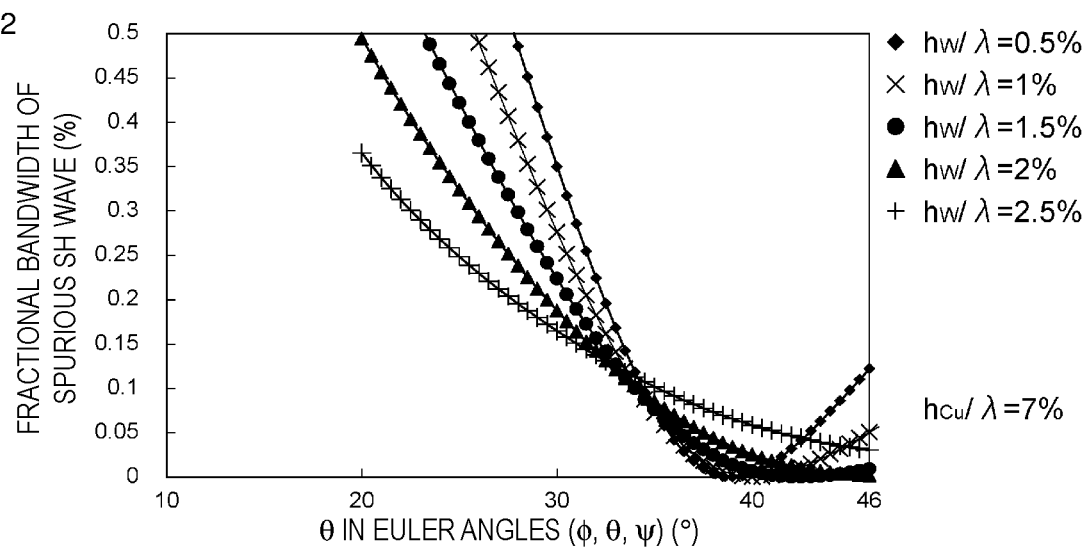
FIG. 42 is a graph indicating a relationship among the film thickness $h_W/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the sixth preferred embodiment of the present invention.

FIG. 42 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 7% in the sixth preferred embodiment. FIG. 42 illustrates the cases in which the film thickness $h_W/\lambda$ of the first electrode layer is about 0.5%, about 1%, about 1.5%, about 2%, and about 2.5%.

As illustrated in FIG. 42, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 21. Therefore, the spurious SH wave is effectively reduced or prevented.

Figure 43:
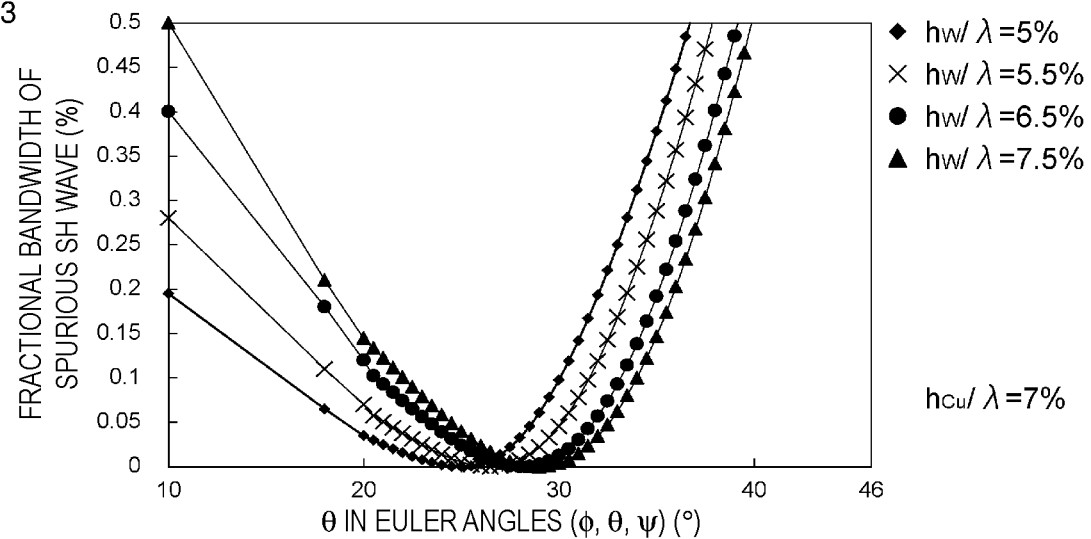
FIG. 43 is a graph indicating a relationship among the film thickness $h_W/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the sixth preferred embodiment of the present invention.

FIG. 43 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 7% in the sixth embodiment. FIG. 43 illustrates the cases in which the film thickness $h_W/\lambda$ of the first electrode layer is about 5%, about 5.5%, about 6.5%, and about 7.5%.

As illustrated in FIG. 43, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 22. Therefore, the spurious SH wave is effectively reduced or prevented.

Figure 44:
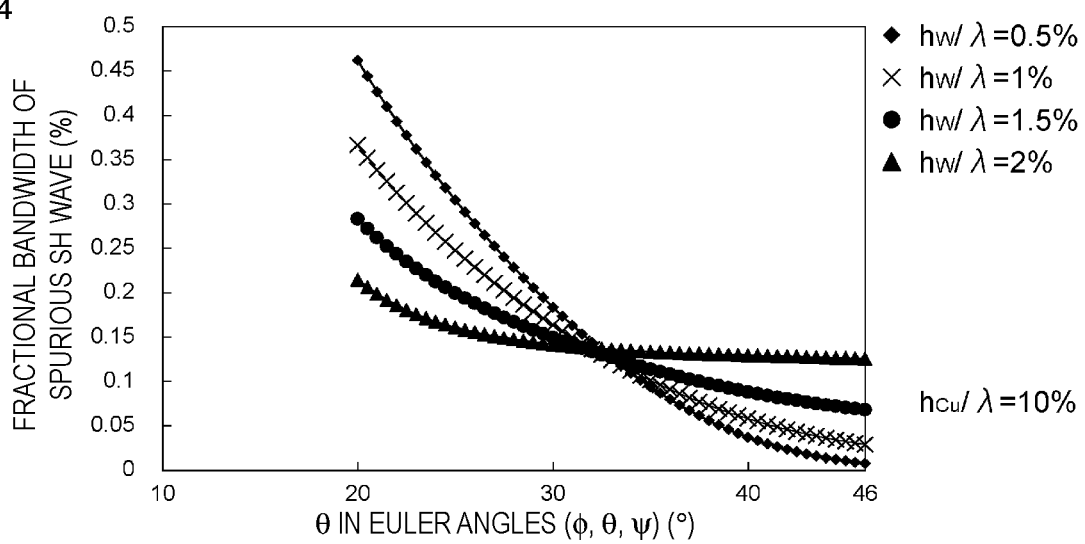
FIG. 44 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the sixth preferred embodiment of the present invention.

FIG. 44 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the sixth preferred embodiment. FIG. 44 illustrates the cases in which the film thickness $h_W/\lambda$ of the first electrode layer is about 0.5%, about 1%, about 1.5%, and about 2%.

As illustrated in FIG. 44, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 23. Therefore, the spurious SH wave is effectively reduced or prevented.

Figure 45:
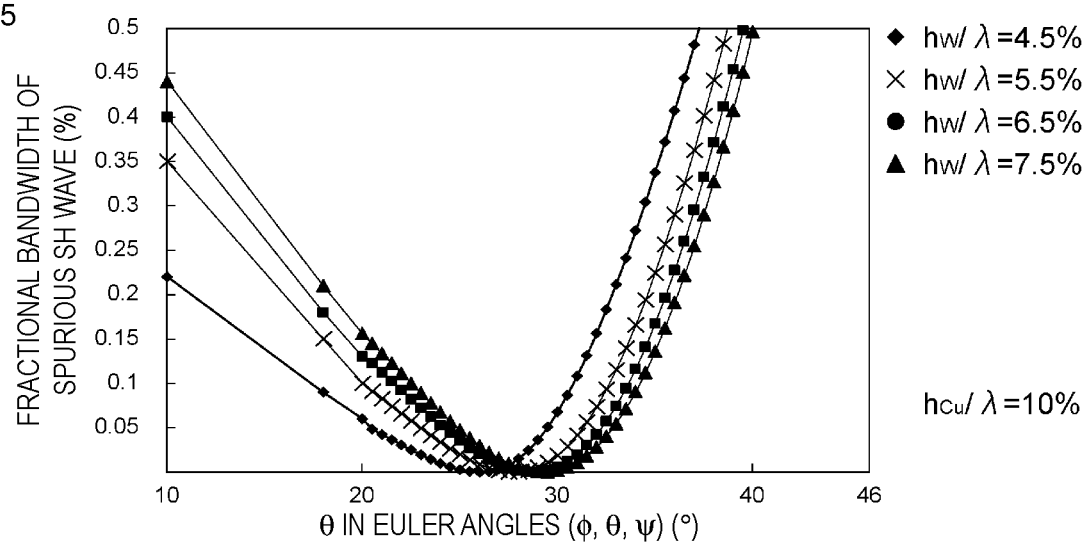
FIG. 45 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the sixth preferred embodiment of the present invention.

FIG. 45 is a graph indicating a relationship among the film thickness $h_W/\lambda$ of the first electrode layer, $\theta$ in the Euler Angles ($\phi$, $\theta$, $\psi$), and the fractional bandwidth of the spurious SH wave when the film thickness $h_{Cu}/\lambda$ of the second electrode layer is about 10% in the sixth preferred embodiment. FIG. 45 illustrates the cases in which the film thickness $h_W/\lambda$ of the first electrode layer is about 4.5%, about 5.5%, about 6.5%, and about 7.5%.

As illustrated in FIG. 45, the fractional bandwidth of the spurious SH wave is reduced to be equal to or lower than about 0.15% with the combination of the film thickness $h_W/\lambda$ of the first electrode layer, the film thickness $h_{Cu}/\lambda$ of the second electrode layer, and the Euler Angles ($\phi$, $\theta$, $\psi$) of the piezoelectric substrate as indicated in Table 24. Therefore, the spurious SH wave is effectively reduced or prevented.

The effect that is the same or similar as that described above is able to be provided even when the Euler Angles ($\phi$, $\theta$, $\psi$) of the piezoelectric substrate are Euler Angles (0°±5°, $\theta$, 0°±5°).

A non-limiting example of a method for manufacturing the elastic wave device according to a preferred embodiment of the present invention is described below.

FIGS. 46A to 46D are cross-sectional front views for explaining a method for manufacturing an elastic wave device according to a preferred embodiment of the present invention. FIGS. 47A to 47D are cross-sectional front views for explaining a method for manufacturing an elastic wave device according to a preferred embodiment of the present invention.

Figure 46A:
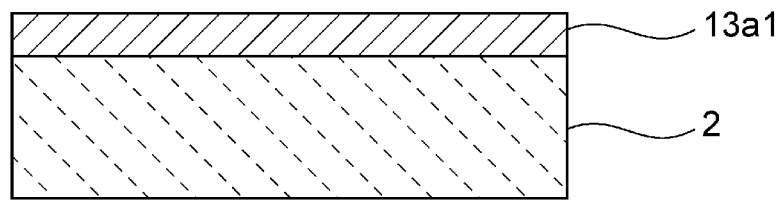
FIGS. 46A to 46D are cross-sectional front views for explaining a method for manufacturing an elastic wave device according to a preferred embodiment of the present invention.

As illustrated in FIG. 46A, a piezoelectric substrate 2 is prepared. Then, a first metal film 13a1 for the first electrode layer is formed on the piezoelectric substrate 2. The first metal film 13a1 is preferably made of Mo or W, for example. The first metal film 13a1 is preferably formed by a sputtering method because it is made of metal having a high melting point.

Figure 46B:
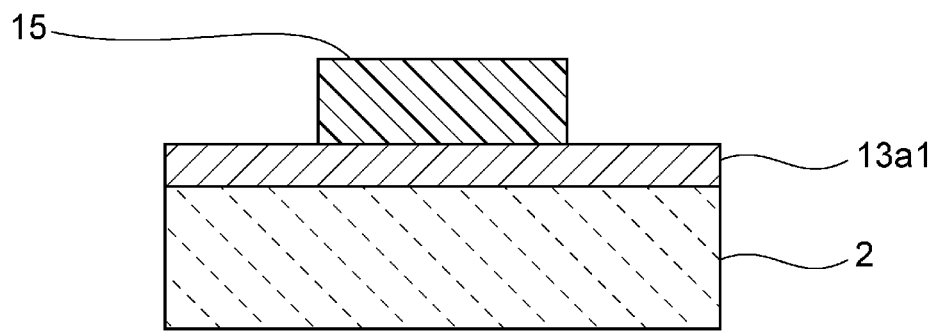
Figure 46C:
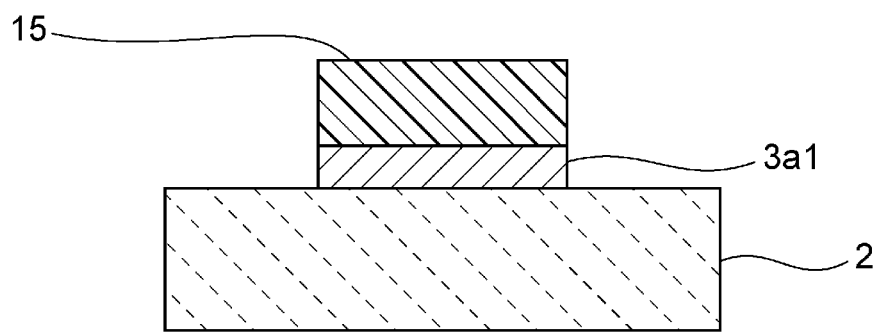

Then, as illustrated in FIG. 46B, a first resist pattern 15 is formed on the first metal film 13a1 by a photolithography method. Subsequently, the first metal film 13a1 other than a portion that is covered by the first resist pattern 15 is removed by dry etching. The first electrode layer 3a1 is thus obtained as illustrated in FIG. 46C. For example, halogen gas can be used in the above-described dry etching.

Figure 46D:
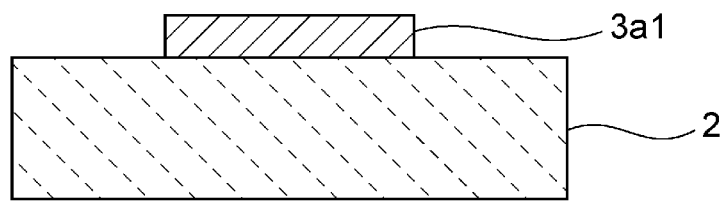
Figure 47A:
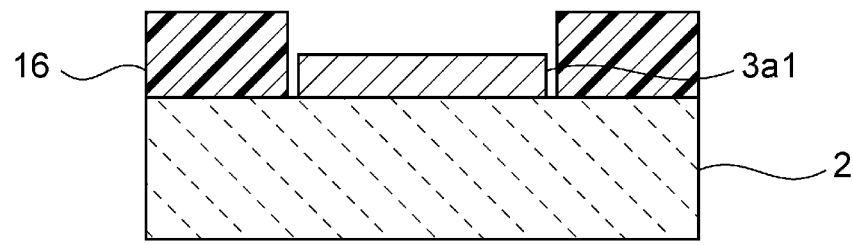
FIGS. 47A to 47D are cross-sectional front views for explaining a method for manufacturing an elastic wave device according to a preferred embodiment of the present invention.
Figure 47B:
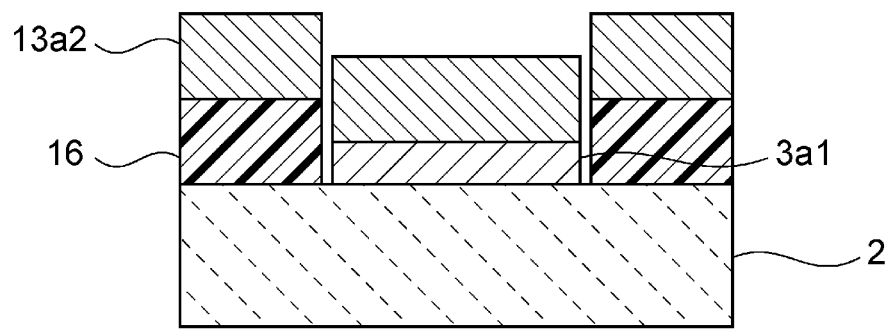

Then, as illustrated in FIG. 46D, the first resist pattern is removed. Subsequently, the second electrode layer is formed by a lift-off method. To be more specific, after the first resist pattern is removed, as illustrated in FIG. 47A, a second resist pattern 16 is formed on the piezoelectric substrate 2 by the photolithography method. Thereafter, as illustrated in FIG. 47B, a second metal film 13a2 for the second electrode layer is formed on the second resist pattern 16 and the first electrode layer 3a1 by an evaporation method.

Figure 47C:
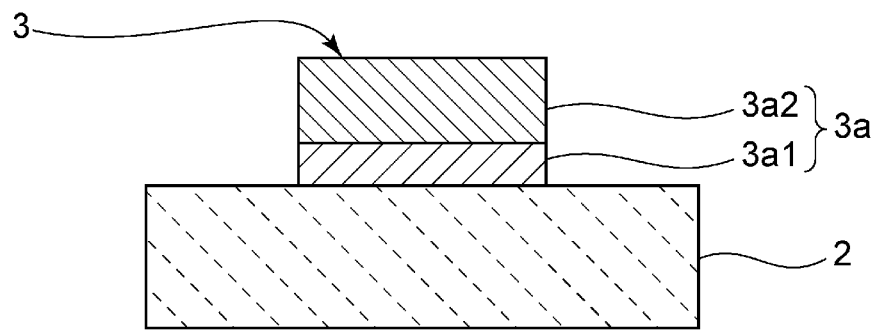

Subsequently, the second resist pattern 16 is separated together with the second metal film 13a2 on the second resist pattern 16. With these processes, the IDT electrode 3 in which the first electrode layer 3a1 and the second electrode layer 3a2 are laminated is obtained as illustrated in FIG. 47C.

As described above, it is preferable that the film thickness $h_{Mo}/\lambda$ or $h_W/\lambda$ of the first electrode layer 3a1 be equal to or lower than about 30%, for example. With this film thickness, the second resist pattern 16 illustrated in FIG. 47B is able to be easily separated. Accordingly, productivity is improved. In addition, an increase in the stress of the first electrode layer 3a1 is reduced or prevented and the piezoelectric substrate 2 will not be easily damaged.

It is preferable that the film thickness $h_{Cu}/\lambda$ of the second electrode layer 3a2 be equal to or lower than about 15%, for example. Also in this case, the second resist pattern 16 is able to be easily separated and the productivity is improved.

Figure 47D:
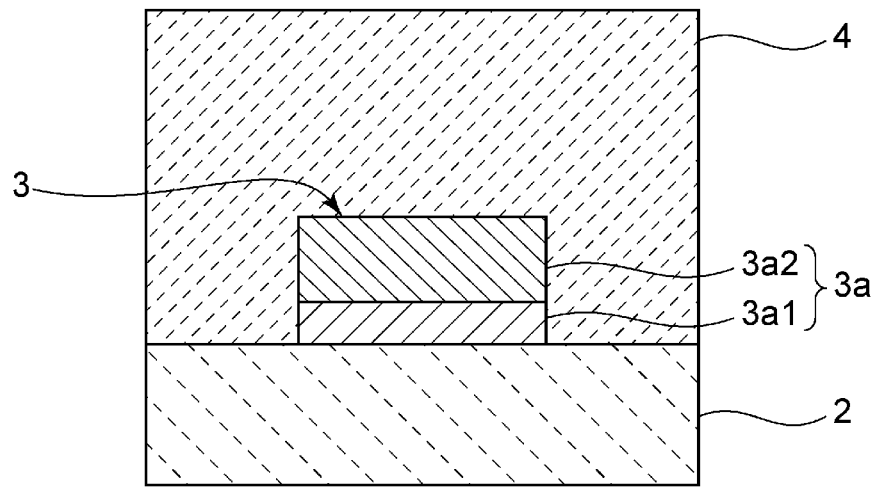

Thereafter, as illustrated in FIG. 47D, the dielectric film 4 is formed on the piezoelectric substrate 2 so as to cover the IDT electrode 3. The dielectric film 4 may be formed by, for example, a bias sputtering method or other suitable method.

It should be noted that a layer other than the first electrode layer 3a1 and the second electrode layer 3a2 may be laminated in a range without impairing the effect of preferred embodiments of the present invention. Furthermore, a frequency adjusting film made of SiN or other suitable material may be formed on the dielectric film 4. With this frequency adjusting film, the frequency is able to be easily adjusted.

The above-described elastic wave devices according to preferred embodiments of the present invention may be used, for example, as a duplexer of a high-frequency front end circuit, or other suitable device. This example will be described below.

Figure 48:
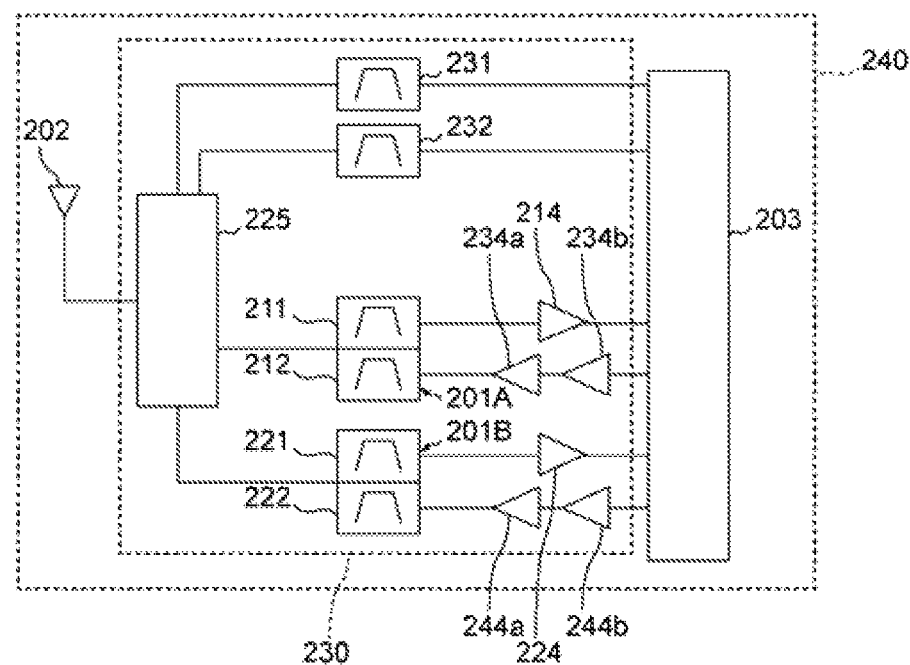
FIG. 48 is a configuration view of a communication apparatus including a high-frequency front end circuit.

FIG. 48 is a diagram of a communication apparatus including the high-frequency front end circuit. FIG. 48 also illustrates respective components that are connected to a high-frequency front end circuit 230, for example, an antenna element 202 and an RF signal processing circuit (RFIC) 203. The high-frequency front end circuit 230 and the RF signal processing circuit 203 define a communication apparatus 240. It should be noted that the communication apparatus 240 may preferably include a power supply, a CPU (central processing unit), and a display, for example.

The high-frequency front end circuit 230 includes a switch 225, duplexers 201A and 201B, filters 231 and 232, and power amplifier circuits 234a, 234b, 244a, and 244b. The high-frequency front end circuit 230 and the communication apparatus 240 in FIG. 48 are examples of the high-frequency front end circuit and the communication apparatus, respectively, and they are not limited to these configurations.

The duplexer 201A includes filters 211 and 212. The duplexer 201B includes filters 221 and 222. The duplexers 201A and 201B are connected to the antenna element 202 with the switch 225 interposed therebetween. The above-described elastic wave devices according to preferred embodiments of the present invention may define the duplexers 201A and 201B or the filters 211, 212, 221, and 222. The above-described elastic wave devices according to preferred embodiments of the present invention may be elastic wave resonators defining the duplexers 201A and 201B or the filters 211, 212, 221, and 222. Moreover, the above-described elastic wave devices according to preferred embodiments of the present invention may also be applied to a multiplexer including three filters or more filters, such as a triplexer in which an antenna terminal is common to three filters and a hexaplexer in which an antenna terminal is common to six filters.

That is to say, the above-described elastic wave devices according to preferred embodiments of the present invention includes the elastic wave resonator, the filter, the duplexer, and the multiplexer including equal to or more than three filters. The multiplexer is not limited to a configuration including both of a transmission filter and a reception filter and may have a configuration including only the transmission filter or only the reception filter.

The switch 225 connects the antenna element 202 and a signal path corresponding to a predetermined band in accordance with a control signal from a controller (not illustrated), and is preferably defined by, for example, an SPDT (Single Pole Double Throw)-type switch. The signal path that is connected to the antenna element 202 is not limited to one and a plurality of signal paths may be connected to the antenna element 202. That is to say, the high-frequency front end circuit 230 may be compatible with carrier aggregation.

The low noise amplifier circuit 214 is a reception amplification circuit that amplifies a high-frequency signal (high-frequency reception signal in this example) after passing through the antenna element 202, the switch 225, and the duplexer 201A, and outputs it to the RF signal processing circuit 203. The low noise amplifier circuit 224 is a reception amplification circuit that amplifies a high-frequency signal (high-frequency reception signal in this example) after passing through the antenna element 202, the switch 225, and the duplexer 201B, and outputs it to the RF signal processing circuit 203.

The power amplifier circuits 234a and 234b are transmission amplification circuits that amplify a high-frequency signal (high-frequency transmission signal in this example) output from the RF signal processing circuit 203 and output it to the antenna element 202 through the duplexer 201A and the switch 225. The power amplifier circuit 244a and 244b are transmission amplification circuits that amplify a high-frequency signal (high-frequency transmission signal in this example) output from the RF signal processing circuit 203 and output it to the antenna element 202 through the duplexer 201B and the switch 225.

The RF signal processing circuit 203 performs signal processing on the high-frequency reception signal input from the antenna element 202 while passing through the reception signal path by down conversion or other suitable process, and outputs a reception signal generated by the signal processing. The RF signal processing circuit 203 performs signal processing on the input transmission signal by up-conversion or other suitable process, and outputs a high-frequency transmission signal generated by the signal processing to the power amplifier circuits 234b and 244b. The RF signal processing circuit 203 is preferably, for example, an RFIC. The signal provided by processing by the RF signal processing circuit 203 is input to a baseband signal processing circuit. The signal provided by processing by the baseband signal processing circuit is used, for example, as an image signal for image display or as an audio signal for telephone call. It should be noted that the high-frequency front end circuit 230 may include another circuit element between the above-described components. The high-frequency front end circuit 230 may include duplexers according to a variation on the duplexers 201A and 201B, instead of the above-described duplexers 201A and 201B.

The filters 231 and 232 in the communication apparatus 240 are preferably connected between the RF signal processing circuit 203 and the switch 225 with no low noise amplifier circuit and no power amplifier circuit interposed therebetween. The filters 231 and 232 are preferably connected to the antenna element 202 with the switch 225 interposed therebetween in the same or similar manner as the duplexers 201A and 201B.

The high-frequency front end circuit 230 and the communication apparatus 240 configured as described above improves the trade-off relationship between the frequency temperature characteristic (TCV) and the fractional bandwidth by including the elastic wave resonator, the filter, the duplexer, the multiplexer including three or more filters, or other suitable components as the elastic wave device according to a preferred embodiment of the present invention.

Hereinbefore, the elastic wave devices, the high-frequency front end circuits, and the communication apparatuses according to the preferred embodiments of the present invention have been described using the above-described preferred embodiments and variations thereon. The present invention also encompasses other preferred embodiments that are implemented by combining desired components in the above-described preferred embodiments and variations, variations obtained by adding various changes to the above-described preferred embodiments, which are conceived by those skilled in the art, without departing from the gist of the present invention, and various apparatuses incorporating the high-frequency front end circuit or the communication apparatus according to the present invention.

Preferred embodiments of the present invention are able to be widely used for communication equipment, such as a cellular phone, as the elastic wave resonator, the filter, the duplexer, the multiplexer capable of being applied to a multiband system, the front end circuit, or the communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
an IDT electrode including a first electrode layer which is provided on the piezoelectric substrate and includes Mo as a main component and a second electrode layer which is laminated on the first electrode layer and includes Cu as a main component; and
a dielectric film that is provided on the piezoelectric substrate and covers the IDT electrode; wherein
the first electrode layer of the IDT electrode is provided on a flat main surface of the piezoelectric substrate;
the piezoelectric substrate is made of lithium niobate;
the dielectric film is made of silicon oxide;
the elastic wave device utilizes Rayleigh waves propagating along the piezoelectric substrate; and
when a wave length which is defined by an electrode finger pitch of the IDT electrode is $\lambda$ and a film thickness of the first electrode layer that is provided on the flat main surface of the piezoelectric substrate and a film thickness of the second electrode layer that is laminated on the first electrode layer and spaced apart from the flat main surface of the piezoelectric substrate, which are normalized by the wave length $\lambda$, are $h_{Mo}/\lambda(\%)$ and $h_{Cu}/\lambda(\%)$, respectively, the following is satisfied:

$$30 \geq h_{Mo}/\lambda \geq -0.8 \times h_{Cu}/\lambda + 1.8.$$

2. The elastic wave device according to claim 1, wherein Euler Angles ($\phi$, $\theta$, $\psi$) of the piezoelectric substrate are Euler Angles (0°±5°, $\theta$, 0°±5°); and
a combination of the film thickness $h_{Mo}/\lambda$ of the first electrode layer, the film thickness $h_{Cu}/\lambda$ of the second electrode layer, and $\theta$ in the Euler Angles ($\phi$, $\theta$, $\psi$) of the piezoelectric substrate is any one of combinations indicated in Table 1 to Table 6:

TABLE 1

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $h_{Cu}/\lambda \leq 5.5$ | $0 < -0.8 \times h_{Cu}/\lambda + 1.8 \leq h_{Mo}/\lambda < 2.75$ | $34.7 \leq \theta \leq 41.4$ |
| $h_{Cu}/\lambda \leq 5.5$ | $2.75 \leq h_{Mo}/\lambda < 4.25$ | $33.6 \leq \theta \leq 45.7$ |
| $h_{Cu}/\lambda \leq 5.5$ | $4.25 \leq h_{Mo}/\lambda < 5.75$ | $32.8 \leq \theta \leq 46$ |
| $h_{Cu}/\lambda \leq 5.5$ | $5.75 \leq h_{Mo}/\lambda \leq 7.25$ | $32.2 \leq \theta \leq 46$ |

TABLE 2

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $h_{Cu}/\lambda \leq 5.5$ | $12.5 \leq h_{Mo}/\lambda < 15.5$ | $10 \leq \theta \leq 31.7$ |
| $h_{Cu}/\lambda \leq 5.5$ | $15.5 \leq h_{Mo}/\lambda < 18.5$ | $13.4 \leq \theta \leq 34.1$ |
| $h_{Cu}/\lambda \leq 5.5$ | $18.5 \leq h_{Mo}/\lambda < 21.5$ | $15.9 \leq \theta \leq 35.3$ |
| $h_{Cu}/\lambda \leq 5.5$ | $21.5 \leq h_{Mo}/\lambda \leq 24.5$ | $17.4 \leq \theta \leq 36.2$ |

TABLE 3

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $5.5 < h_{Cu}/\lambda \leq 8.5$ | $0 < -0.8 \times h_{Cu}/\lambda + 1.8 \leq h_{Mo}/\lambda < 2.75$ | $32.8 \leq \theta \leq 46$ |
| $5.5 < h_{Cu}/\lambda \leq 8.5$ | $2.75 \leq h_{Mo}/\lambda \leq 4.25$ | $32 \leq \theta \leq 46$ |

TABLE 4

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $5.5 < h_{Cu}/\lambda \leq 8.5$ | $9.5 \leq h_{Mo}/\lambda < 12.5$ | $10 \leq \theta \leq 31.2$ |
| $5.5 < h_{Cu}/\lambda \leq 8.5$ | $12.5 \leq h_{Mo}/\lambda < 15.5$ | $15.2 \leq \theta \leq 34$ |
| $5.5 < h_{Cu}/\lambda \leq 8.5$ | $15.5 \leq h_{Mo}/\lambda < 18.5$ | $16.3 \leq \theta \leq 35.2$ |
| $5.5 < h_{Cu}/\lambda \leq 8.5$ | $18.5 \leq h_{Mo}/\lambda < 21.5$ | $16.8 \leq \theta \leq 36$ |
| $5.5 < h_{Cu}/\lambda \leq 8.5$ | $21.5 \leq h_{Mo}/\lambda \leq 24.5$ | $17.5 \leq \theta \leq 37$ |

TABLE 5

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $8.5 < h_{Cu}/\lambda \leq 11.5$ | $0 < -0.8 \times h_{Cu}/\lambda + 1.8 \leq h_{Mo}/\lambda < 2.75$ | $31.8 \leq \theta \leq 46$ |

TABLE 6

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $8.5 < h_{Cu}/\lambda \leq 11.5$ | $6.5 \leq h_{Mo}/\lambda < 9.5$ | $10 \leq \theta \leq 31.2$ |
| $8.5 < h_{Cu}/\lambda \leq 11.5$ | $9.5 \leq h_{Mo}/\lambda < 12.5$ | $12.2 \leq \theta \leq 33.8$ |
| $8.5 < h_{Cu}/\lambda \leq 11.5$ | $12.5 \leq h_{Mo}/\lambda < 15.5$ | $14.2 \leq \theta \leq 35$ |
| $8.5 < h_{Cu}/\lambda \leq 11.5$ | $15.5 \leq h_{Mo}/\lambda < 18.5$ | $15.5 \leq \theta \leq 36$ |
| $8.5 < h_{Cu}/\lambda \leq 11.5$ | $18.5 \leq h_{Mo}/\lambda < 21.5$ | $15.9 \leq \theta \leq 36.8$ |
| $8.5 < h_{Cu}/\lambda \leq 11.5$ | $21.5 \leq h_{Mo}/\lambda \leq 24.5$ | $16.3 \leq \theta \leq 37.8$ |

3. The elastic wave device according to claim 1, wherein the film thickness $h_{Cu}/\lambda$ of the second electrode layer is equal to or lower than about 15%.

4. The elastic wave device according to claim 1, wherein the dielectric film is made of $SiO_2$.

5. A high-frequency front end circuit comprising:
the elastic wave device according to claim 1; and
a power amplifier.

6. The high-frequency front end circuit according to claim 5, wherein
the film thickness $h_{Mo}/\lambda$ of the first electrode layer is equal to or lower than about 30%.

7. The high-frequency front end circuit according to claim 5, wherein
Euler Angles ($\phi$, $\theta$, $\psi$) of the piezoelectric substrate are Euler Angles (0°±5°, $\theta$, 0°±5°); and
a combination of the film thickness $h_{Mo}/\lambda$ of the first electrode layer, the film thickness $h_{Cu}/\lambda$ of the second electrode layer, and $\theta$ in the Euler Angles ($\phi$, $\theta$, $\psi$) of the piezoelectric substrate is any one of combinations indicated in Table 1 to Table 6:

TABLE 1

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $h_{Cu}/\lambda \leq 5.5$ | $0 < -0.8 \times h_{Cu}/\lambda + 1.8 \leq h_{Mo}/\lambda < 2.75$ | $34.7 \leq \theta \leq 41.4$ |
| $h_{Cu}/\lambda \leq 5.5$ | $2.75 \leq h_{Mo}/\lambda < 4.25$ | $33.6 \leq \theta \leq 45.7$ |
| $h_{Cu}/\lambda \leq 5.5$ | $4.25 \leq h_{Mo}/\lambda < 5.75$ | $32.8 \leq \theta \leq 46$ |
| $h_{Cu}/\lambda \leq 5.5$ | $5.75 \leq h_{Mo}/\lambda \leq 7.25$ | $32.2 \leq \theta \leq 46$ |

TABLE 2

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $h_{Cu}/\lambda \leq 5.5$ | $12.5 \leq h_{Mo}/\lambda < 15.5$ | $10 \leq \theta \leq 31.7$ |
| $h_{Cu}/\lambda \leq 5.5$ | $15.5 \leq h_{Mo}/\lambda < 18.5$ | $13.4 \leq \theta \leq 34.1$ |
| $h_{Cu}/\lambda \leq 5.5$ | $18.5 \leq h_{Mo}/\lambda < 21.5$ | $15.9 \leq \theta \leq 35.3$ |
| $h_{Cu}/\lambda \leq 5.5$ | $21.5 \leq h_{Mo}/\lambda \leq 24.5$ | $17.4 \leq \theta \leq 36.2$ |

TABLE 3

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $5.5 < h_{Cu}/\lambda \leq 8.5$ | $0 < -0.8 \times h_{Cu}/\lambda + 1.8 \leq h_{Mo}/\lambda < 2.75$ | $32.8 \leq \theta \leq 46$ |
| $5.5 < h_{Cu}/\lambda \leq 8.5$ | $2.75 \leq h_{Mo}/\lambda \leq 4.25$ | $32 \leq \theta \leq 46$ |

TABLE 4

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $5.5 < h_{Cu}/\lambda \leq 8.5$ | $9.5 \leq h_{Mo}/\lambda < 12.5$ | $10 \leq \theta \leq 31.2$ |
| $5.5 < h_{Cu}/\lambda \leq 8.5$ | $12.5 \leq h_{Mo}/\lambda < 15.5$ | $15.2 \leq \theta \leq 34$ |
| $5.5 < h_{Cu}/\lambda \leq 8.5$ | $15.5 \leq h_{Mo}/\lambda < 18.5$ | $16.3 \leq \theta \leq 35.2$ |
| $5.5 < h_{Cu}/\lambda \leq 8.5$ | $18.5 \leq h_{Mo}/\lambda < 21.5$ | $16.8 \leq \theta \leq 36$ |
| $5.5 < h_{Cu}/\lambda \leq 8.5$ | $21.5 \leq h_{Mo}/\lambda \leq 24.5$ | $17.5 \leq \theta \leq 37$ |

TABLE 5

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $8.5 < h_{Cu}/\lambda \leq 11.5$ | $0 < -0.8 \times h_{Cu}/\lambda + 1.8 \leq h_{Mo}/\lambda < 2.75$ | $31.8 \leq \theta \leq 46$ |

TABLE 6

| FILM THICKNESS OF SECOND ELECTRODE LAYER $h_{Cu}/\lambda$ (%) | FILM THICKNESS OF FIRST ELECTRODE LAYER $h_{Mo}/\lambda$ (%) | $\theta$ (°) |
|---|---|---|
| $8.5 < h_{Cu}/\lambda \leq 11.5$ | $6.5 \leq h_{Mo}/\lambda < 9.5$ | $10 \leq \theta \leq 31.2$ |
| $8.5 < h_{Cu}/\lambda \leq 11.5$ | $9.5 \leq h_{Mo}/\lambda < 12.5$ | $12.2 \leq \theta \leq 33.8$ |
| $8.5 < h_{Cu}/\lambda \leq 11.5$ | $12.5 \leq h_{Mo}/\lambda < 15.5$ | $14.2 \leq \theta \leq 35$ |
| $8.5 < h_{Cu}/\lambda \leq 11.5$ | $15.5 \leq h_{Mo}/\lambda < 18.5$ | $15.5 \leq \theta \leq 36$ |
| $8.5 < h_{Cu}/\lambda \leq 11.5$ | $18.5 \leq h_{Mo}/\lambda < 21.5$ | $15.9 \leq \theta \leq 36.8$ |
| $8.5 < h_{Cu}/\lambda \leq 11.5$ | $21.5 \leq h_{Mo}/\lambda \leq 24.5$ | $16.3 \leq \theta \leq 37.8$ |

8. The high-frequency front end circuit according to claim 5, wherein the film thickness $h_{Cu}/\lambda$ of the second electrode layer is equal to or lower than about 15%.

9. The high-frequency front end circuit according to claim 5, wherein the dielectric film is made of $SiO_2$.

10. A communication apparatus comprising:
the high-frequency front end circuit according to claim 5, and
a radio frequency signal processing circuit.

11. An elastic wave device comprising:
a piezoelectric substrate;
an IDT electrode including a first electrode layer which is provided on the piezoelectric substrate and includes W as a main component and a second electrode layer which is laminated on the first electrode layer and includes Cu as a main component; and
a dielectric film that is provided on the piezoelectric substrate and covers the IDT electrode; wherein
the first electrode layer of the IDT electrode is provided on a flat main surface of the piezoelectric substrate;
the piezoelectric substrate is made of lithium niobate;
the dielectric film is made of silicon oxide;
the elastic wave device utilizes Rayleigh waves propagating along the piezoelectric substrate; and
when a wave length which is defined by an electrode finger pitch of the IDT electrode is $\lambda$ and a film thickness of the first electrode layer that is provided on the flat main surface of the piezoelectric substrate and a film thickness of the second electrode layer that is laminated on the first electrode layer and spaced apart from the flat main surface of the piezoelectric substrate, which are normalized by the wave length $\lambda$, are $h_W/\lambda$ (%) and $h_{Cu}/\lambda$(%), respectively, the following is satisfied:

$$30 \geq h_W/\lambda \geq -0.3343 \times h_{Cu}/\lambda + 0.7879.$$

12. The elastic wave device according to claim 11, wherein
Euler Angles ($\phi$, $\theta$, $\psi$) of the piezoelectric substrate are Euler Angles (0°±5°, $\theta$, 0°±5°); and
a combination of the film thickness $h_W/\lambda$ of the first electrode layer, the film thickness $h_{Cu}/\lambda$ of the second electrode layer, and $\theta$ in the Euler Angles ($\phi$, $\theta$, $\psi$) of the piezoelectric substrate is any one of combinations indicated in Table 7 to Table 12:

TABLE 7

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
|---|---|---|
| $h_{Cu}/\lambda \leq 5.5$ | $0 < -0.3343 \times h_{Cu}/\lambda + 0.7879 \leq h_W/\lambda < 1.25$ | $34.7 \leq \theta \leq 40.7$ |
| $h_{Cu}/\lambda \leq 5.5$ | $1.25 \leq h_W/\lambda < 1.75$ | $33.8 \leq \theta \leq 43$ |
| $h_{Cu}/\lambda \leq 5.5$ | $1.75 \leq h_W/\lambda < 2.25$ | $33.2 \leq \theta \leq 46$ |
| $h_{Cu}/\lambda \leq 5.5$ | $2.25 \leq h_W/\lambda < 2.75$ | $32.6 \leq \theta \leq 46$ |
| $h_{Cu}/\lambda \leq 5.5$ | $2.75 \leq h_W/\lambda < 3.25$ | $32 \leq \theta \leq 46$ |
| $h_{Cu}/\lambda \leq 5.5$ | $3.25 \leq h_W/\lambda \leq 3.75$ | $31.7 \leq \theta \leq 46$ |

TABLE 8

| FILM THICKNESS OF SECOND ELECTRODE LAYER $h_{Cu}/\lambda$ (%) | FILM THICKNESS OF FIRST ELECTRODE LAYER $h_W/\lambda$ (%) | $\theta$ (°) |
|---|---|---|
| $h_{Cu}/\lambda \leq 5.5$ | $4 \leq h_W/\lambda < 6$ | $10 \leq \theta \leq 29.5$ |
| $h_{Cu}/\lambda \leq 5.5$ | $6 \leq h_W/\lambda < 7$ | $15.7 \leq \theta \leq 32.2$ |
| $h_{Cu}/\lambda \leq 5.5$ | $7 \leq h_W/\lambda \leq 8$ | $18.5 \leq \theta \leq 34.5$ |

TABLE 9

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $5.5 < h_{Cu}/\lambda \le 8.5$ | $0 < -0.3343 \times h_{Cu}/\lambda + 0.7879 \le h_{Pt}/\lambda < 0.75$ | $33.3 \le \theta \le 46$ |
| $5.5 < h_{Cu}/\lambda \le 8.5$ | $0.75 \le h_{Pt}/\lambda < 1.25$ | $32.8 \le \theta \le 46$ |
| $5.5 < h_{Cu}/\lambda \le 8.5$ | $1.25 \le h_{Pt}/\lambda < 1.75$ | $32.2 \le \theta \le 46$ |
| $5.5 < h_{Cu}/\lambda \le 8.5$ | $1.75 \le h_{Pt}/\lambda < 2.25$ | $31.6 \le \theta \le 46$ |
| $5.5 < h_{Cu}/\lambda \le 8.5$ | $2.25 \le h_{Pt}/\lambda \le 2.75$ | $31 \le \theta \le 46$ |

TABLE 10

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $5.5 < h_{Cu}/\lambda \le 8.5$ | $4.5 \le h_{Pt}/\lambda < 5.25$ | $12.7 \le \theta \le 31.3$ |
| $5.5 < h_{Cu}/\lambda \le 8.5$ | $5.25 \le h_{Pt}/\lambda < 6$ | $16.2 \le \theta \le 32.6$ |
| $5.5 < h_{Cu}/\lambda \le 8.5$ | $6 \le h_{Pt}/\lambda < 7$ | $19 \le \theta \le 34.3$ |
| $5.5 < h_{Cu}/\lambda \le 8.5$ | $7 \le h_{Pt}/\lambda \le 8$ | $19.8 \le \theta \le 35.2$ |

TABLE 11

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $8.5 < h_{Cu}/\lambda \le 11.5$ | $0 < -0.3343 \times h_{Cu}/\lambda + 0.7879 \le h_{Pt}/\lambda < 0.75$ | $31.8 \le \theta \le 46$ |
| $8.5 < h_{Cu}/\lambda \le 11.5$ | $0.75 \le h_{Pt}/\lambda < 1.25$ | $31 \le \theta \le 46$ |
| $8.5 < h_{Cu}/\lambda \le 11.5$ | $1.25 \le h_{Pt}/\lambda < 1.75$ | $30 \le \theta \le 46$ |
| $8.5 < h_{Cu}/\lambda \le 11.5$ | $1.75 \le h_{Pt}/\lambda < 2.25$ | $27 \le \theta \le 46$ |

TABLE 12

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $8.5 < h_{Cu}/\lambda \le 11.5$ | $4 \le h_{Pt}/\lambda < 5$ | $14.3 \le \theta \le 31.7$ |
| $8.5 < h_{Cu}/\lambda \le 11.5$ | $5 \le h_{Pt}/\lambda < 6$ | $18 \le \theta \le 33.8$ |
| $8.5 < h_{Cu}/\lambda \le 11.5$ | $6 \le h_{Pt}/\lambda < 7$ | $19.2 \le \theta \le 34.8$ |
| $8.5 < h_{Cu}/\lambda \le 11.5$ | $7 \le h_{Pt}/\lambda \le 8$ | $20.2 \le \theta \le 35.3$ |

13. A high-frequency front end circuit comprising:
the elastic wave device according to claim 11; and
a power amplifier.

14. The high-frequency front end circuit according to claim 13, wherein
the film thickness $h_{Pt}/\lambda$ of the first electrode layer is equal to or lower than about 30%.

15. The high-frequency front end circuit according to claim 13, wherein
Euler Angles ($\varphi$, $\theta$, $\psi$) of the piezoelectric substrate are Euler Angles (0°±5°, $\theta$, 0°±5°); and
a combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate is any one of combinations indicated in Table 7 to Table 12:

TABLE 7

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $h_{Cu}/\lambda \le 5.5$ | $0 < -0.3343 \times h_{Cu}/\lambda + 0.7879 \le h_{Pt}/\lambda < 1.25$ | $34.7 \le \theta \le 40.7$ |

TABLE 7-continued

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $h_{Cu}/\lambda \le 5.5$ | $1.25 \le h_{Pt}/\lambda < 1.75$ | $33.8 \le \theta \le 43$ |
| $h_{Cu}/\lambda \le 5.5$ | $1.75 \le h_{Pt}/\lambda < 2.25$ | $33.2 \le \theta \le 46$ |
| $h_{Cu}/\lambda \le 5.5$ | $2.25 \le h_{Pt}/\lambda < 2.75$ | $32.6 \le \theta \le 46$ |
| $h_{Cu}/\lambda \le 5.5$ | $2.75 \le h_{Pt}/\lambda < 3.25$ | $32 \le \theta \le 46$ |
| $h_{Cu}/\lambda \le 5.5$ | $3.25 \le h_{Pt}/\lambda \le 3.75$ | $31.7 \le \theta \le 46$ |

TABLE 8

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $h_{Cu}/\lambda \le 5.5$ | $4 \le h_{Pt}/\lambda < 6$ | $10 \le \theta \le 29.5$ |
| $h_{Cu}/\lambda \le 5.5$ | $6 \le h_{Pt}/\lambda < 7$ | $15.7 \le \theta \le 32.2$ |
| $h_{Cu}/\lambda \le 5.5$ | $7 \le h_{Pt}/\lambda \le 8$ | $18.5 \le \theta \le 34.5$ |

TABLE 9

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $5.5 < h_{Cu}/\lambda \le 8.5$ | $0 < -0.3343 \times h_{Cu}/\lambda + 0.7879 \le h_{Pt}/\lambda < 0.75$ | $33.3 \le \theta \le 46$ |
| $5.5 < h_{Cu}/\lambda \le 8.5$ | $0.75 \le h_{Pt}/\lambda < 1.25$ | $32.8 \le \theta \le 46$ |
| $5.5 < h_{Cu}/\lambda \le 8.5$ | $1.25 \le h_{Pt}/\lambda < 1.75$ | $32.2 \le \theta \le 46$ |
| $5.5 < h_{Cu}/\lambda \le 8.5$ | $1.75 \le h_{Pt}/\lambda < 2.25$ | $31.6 \le \theta \le 46$ |
| $5.5 < h_{Cu}/\lambda \le 8.5$ | $2.25 \le h_{Pt}/\lambda \le 2.75$ | $31 \le \theta \le 46$ |

TABLE 10

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $5.5 < h_{Cu}/\lambda \le 8.5$ | $4.5 \le h_{Pt}/\lambda < 5.25$ | $12.7 \le \theta \le 31.3$ |
| $5.5 < h_{Cu}/\lambda \le 8.5$ | $5.25 \le h_{Pt}/\lambda < 6$ | $16.2 \le \theta \le 32.6$ |
| $5.5 < h_{Cu}/\lambda \le 8.5$ | $6 \le h_{Pt}/\lambda < 7$ | $19 \le \theta \le 34.3$ |
| $5.5 < h_{Cu}/\lambda \le 8.5$ | $7 \le h_{Pt}/\lambda \le 8$ | $19.8 \le \theta \le 35.2$ |

TABLE 11

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $8.5 < h_{Cu}/\lambda \le 11.5$ | $0 < -0.3343 \times h_{Cu}/\lambda + 0.7879 \le h_{Pt}/\lambda < 0.75$ | $31.8 \le \theta \le 46$ |
| $8.5 < h_{Cu}/\lambda \le 11.5$ | $0.75 \le h_{Pt}/\lambda < 1.25$ | $31 \le \theta \le 46$ |
| $8.5 < h_{Cu}/\lambda \le 11.5$ | $1.25 \le h_{Pt}/\lambda < 1.75$ | $30 \le \theta \le 46$ |
| $8.5 < h_{Cu}/\lambda \le 11.5$ | $1.75 \le h_{Pt}/\lambda < 2.25$ | $27 \le \theta \le 46$ |

TABLE 12

| FILM THICKNESS OF SECOND ELECTRODE LAYER $h_{Cu}/\lambda$ (%) | FILM THICKNESS OF FIRST ELECTRODE LAYER $h_{Pt}/\lambda$ (%) | $\theta$ (°) |
| --- | --- | --- |
| $8.5 < h_{Cu}/\lambda \le 11.5$ | $4 \le h_{Pt}/\lambda < 5$ | $14.3 \le \theta \le 31.7$ |
| $8.5 < h_{Cu}/\lambda \le 11.5$ | $5 \le h_{Pt}/\lambda < 6$ | $18 \le \theta \le 33.8$ |
| $8.5 < h_{Cu}/\lambda \le 11.5$ | $6 \le h_{Pt}/\lambda < 7$ | $19.2 \le \theta \le 34.8$ |
| $8.5 < h_{Cu}/\lambda \le 11.5$ | $7 \le h_{Pt}/\lambda \le 8$ | $20.2 \le \theta \le 35.3$ |

16. The elastic wave device according to claim 11, wherein the film thickness $h_{Cu}/\lambda$ of the second electrode layer is equal to or lower than about 15%.

17. The elastic wave device according to claim 11, wherein the dielectric film is made of $SiO_2$.

18. A communication apparatus comprising:
   the high-frequency front end circuit according to claim 13, and
   a radio frequency signal processing circuit.

* * * * *